(12) United States Patent
Fingerhut et al.

(10) Patent No.: US 9,245,626 B2
(45) Date of Patent: Jan. 26, 2016

(54) SYSTEM AND METHOD FOR PACKET CLASSIFICATION AND INTERNET PROTOCOL LOOKUP IN A NETWORK ENVIRONMENT

(71) Applicant: CISCO TECHNOLOGY, INC., San Jose, CA (US)

(72) Inventors: John Andrew Fingerhut, San Jose, CA (US); Balamurugan Ramaraj, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 475 days.

(21) Appl. No.: 13/661,356

(22) Filed: Oct. 26, 2012

(65) Prior Publication Data

US 2014/0122791 A1    May 1, 2014

(51) Int. Cl.
*G06F 13/00* (2006.01)
*G06F 13/28* (2006.01)
*G11C 15/00* (2006.01)
*H04L 12/701* (2013.01)
*H04L 12/931* (2013.01)

(52) U.S. Cl.
CPC ............... *G11C 15/00* (2013.01); *H04L 45/00* (2013.01); *H04L 49/00* (2013.01)

(58) Field of Classification Search
CPC ....................................................... G11C 11/00
See application file for complete search history.

(56) References Cited

U.S. PATENT DOCUMENTS

| | | | |
|---|---|---|---|
| 6,522,632 B1 | 2/2003 | Waters et al. | |
| 7,162,572 B2 | 1/2007 | Somasundaram | |
| 7,292,162 B2 | 11/2007 | Somasundaram | |
| 7,296,113 B2 | 11/2007 | Somasundaram | |
| 7,296,114 B2 | 11/2007 | Somasundaram | |
| 7,321,952 B2 | 1/2008 | Somasundaram | |
| 7,406,561 B2 | 7/2008 | Somasundaram | |
| 7,603,346 B1 | 10/2009 | Depelteau et al. | |
| 7,653,619 B1 | 1/2010 | Depelteau et al. | |
| 7,725,450 B1 | 5/2010 | Depelteau et al. | |
| 7,747,599 B1 | 6/2010 | Depelteau et al. | |
| 7,805,427 B1 | 9/2010 | Depelteau et al. | |
| 7,831,626 B1 | 11/2010 | Depelteau et al. | |
| 7,904,642 B1 * | 3/2011 | Gupta et al. | 711/108 |
| 7,934,198 B2 | 4/2011 | Gruner et al. | |
| 7,953,721 B1 | 5/2011 | Depelteau et al. | |
| 7,987,205 B1 | 7/2011 | Depelteau et al. | |
| 8,086,641 B1 | 12/2011 | Carr | |
| 2013/0254512 A1 * | 9/2013 | Takeda | 711/171 |
| 2014/0006706 A1 * | 1/2014 | Wang | 711/108 |

OTHER PUBLICATIONS

Spitznagel et al., "Packet Classification Using Extended TCAMs," 11th IEEE International Conference on Network Protocols. Atlanta, Georgia, Nov. 4-7, 2003, 12 pages.
Ravikumar V.C., et al., "TCAM Architecture for IP Lookup Using Prefix Properties," Journal IEEE Micro archive, vol. 24 Issue 2, Mar. 2004, 10 pages.

* cited by examiner

*Primary Examiner* — Eric S Cardwell
(74) *Attorney, Agent, or Firm* — Patent Capital Group

(57) ABSTRACT

An example method includes partitioning a memory element of a router into a plurality of segments having one or more rows, where at least a portion of the one or more rows is encoded with a value mask (VM) list having a plurality of values and masks. The VM list is identified by a label, and the label is mapped to a base row number and a specific number of bits corresponding to the portion encoding the VM list. Another example method includes partitioning a prefix into a plurality of blocks, indexing to a hash table using a value of a specific block, where a bucket of the hash table corresponds to a segment of a ternary content addressable memory of a router, and storing the prefix in a row of the segment.

20 Claims, 20 Drawing Sheets

| ACE NUMBER | PROTOCOL (PROTO) 8 BITS | SOURCE IP ADDRESS (SRC-IP) 32 BITS | SOURCE PORT (SRC-PORT) 16 BITS | DESTINATION IP ADDRESS (DST-IP) 32 BITS | DESTINATION PORT (DST-PORT) 16 BITS | TYPE OF SERVICE (TOS) 6 BITS | ACTION |
|---|---|---|---|---|---|---|---|
| 1 | 6 (TCP) | 128.252.169.* | * | 10.0.*.* | 25 | * | PERMIT |
| 2 | 17 (UDP) | * | * | * | 53 | * | PERMIT |
| 3 | 6 (TCP) | 48.*.51.* | 256-1023 | * | * | 46 | PERMIT |
| 4 | * | * | * | * | * | * | DENY |

| ACE NUMBER | VM NUMBER | VALUE/ MASK | PROTOCOL (PROTO) 8 BITS | SOURCE IP ADDRESS (SRC-IP) 32 BITS | SOURCE PORT (SRC-PORT) 16 BITS | DESTINATION IP ADDRESS (DST-IP) 32 BITS | DESTINATION PORT (DST-PORT) 16 BITS | TYPE OF SERVICE (TOS) 6 BITS |
|---|---|---|---|---|---|---|---|---|
| 1 | 1 | VALUE | 6 | 128.252.169.0 | 0 | 10.0.0.0 | 25 | 0 |
|   |   | MASK | 255 | 255.255.255.0 | 0 | 255.255.0.0 | 65535 | 0 |
| 2 | 2 | VALUE | 17 | 0.0.0.0 | 0 | 0.0.0.0 | 53 | 0 |
|   |   | MASK | 255 | 0.0.0.0 | 0 | 0.0.0.0 | 65535 | 0 |
| 3 | 3 | VALUE | 6 | 48.0.51.0 | 256 | 0.0.0.0 | 0 | 46 |
|   |   | MASK | 255 | 255.0.255.0 | 65280 (FF00) | 0.0.0.0 | 0 | 63 |
|   | 4 | VALUE | 6 | 48.0.51.0 | 512 | 0.0.0.0 | 0 | 46 |
|   |   | MASK | 255 | 255.0.255.0 | 65024 (FE00) | 0.0.0.0 | 0 | 63 |
| 4 | 5 | VALUE | 0 | 0.0.0.0 | 0 | 0.0.0.0 | 0 | 0 |
|   |   | MASK | 0 | 0.0.0.0 | 0 | 0.0.0.0 | 0 | 0 |

```
function round_up_to_power_of_2(j)
        i = 1
        while (i < j) do
                i = 2 * i
        end while
        return i
end function round_up_to_power_of_2
```

FIG. 5

```
function fewest_power_of_2_rows(L)
        // R=number of rows in each segment (e.g. 256)
        i = 2
        while (i <= R) do
                if VM_list_fits_in_i_rows(L, i) then
                        return i
                end if
                i = 2 * i
        end while
        return FAIL   // indicates that VM list may not fit into LPTCAM at all
end function fewest_power_of_2_rows
```

FIG. 6

```
function hardware_size(L)
        // S=number of segments (e.g. 1024)
        // input: L=list of VMS, size(L)=number of VMS in list L
        // output: H=hardware size of L
        if size(L) <= S then
                // L can fit into a single row, or a fraction of a row
                H = round_up_to_power_of_2(size(L))
        else
                // L may require at least 2 rows
                H = (S * fewest_power_of_2_rows(L))
        end if
        return H
end function hardware_size
```

FIG. 7

| SEGMENT 0 | | | | SEGMENT 1 | | | |
|---|---|---|---|---|---|---|---|
| BIT POSITIONS TO EXTRACT: 4, 2, 0 | | | | BIT POSITIONS TO EXTRACT: 4, 3, 1 | | | |
| VM | EXTRACTED BIT VALUES | COMPRESSED VALUE | SEGMENT BIT ARRAY | VM | EXTRACTED BIT VALUES | COMPRESSED VALUE | SEGMENT BIT ARRAY |
|  |  |  | 0 | 00*0* | 000 | 0 | 1 |
| 0*0*1 | 001 | 0 | 1 | 00*11 | 001 | 1 | 1 |
| 00110 | 010 | 1 | 1 |  |  |  | 0 |
| 011*1 | 011 | 2 | 1 | 01011 | 011 | 2 | 1 |
| 1*000 | 100 | 3 | 1 | 10001 | 100 | 3 | 1 |
|  |  |  | 0 |  |  |  | 0 |
|  |  |  | 0 | 1110* | 110 | 4 | 1 |
| 11101 | 111 | 4 | 1 | 11*10 | 111 | 5 | 1 |

FIG. 11

```
function decision_tree_search(K, numbits, T)
        // input:
        // K is the search key
        // numbits is the number of bits to extract
        // T is the root node of the decision tree
        // output: A=list of bits formed by selecting bits from search key
        A = empty list
        N = T
        while (N is not null) do
                p = bit position stored in tree node N
                b = extracted bit position p from search key K
                A = append bit value b to end of A
                if b = 0 then
                        N = left child of N if there is one, otherwise null
                else
                        N = right child of N if there is one, otherwise null
                end if
        end while
        return A
end function decision_tree_search
```

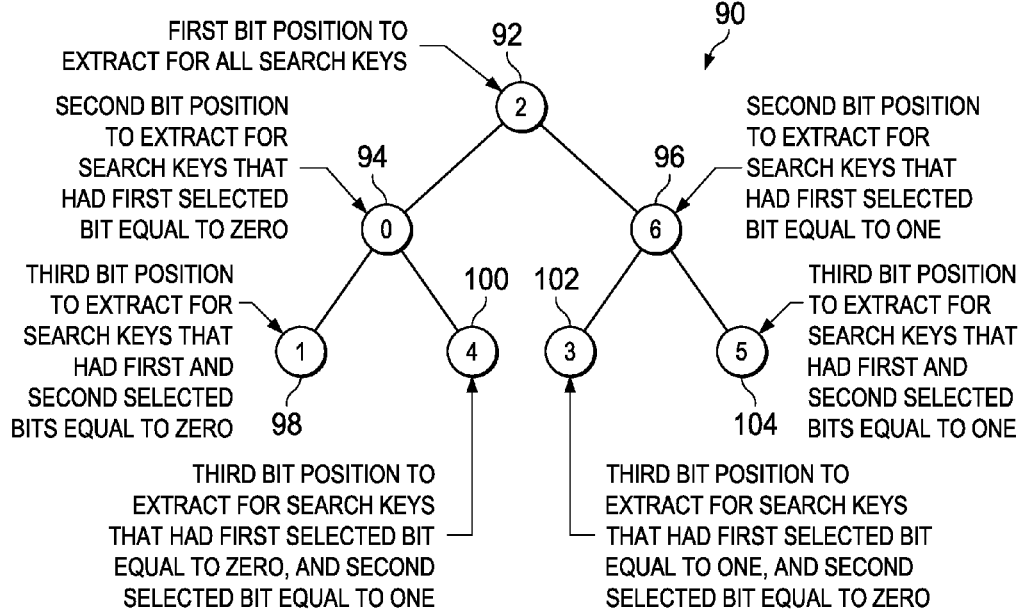

FIG. 12

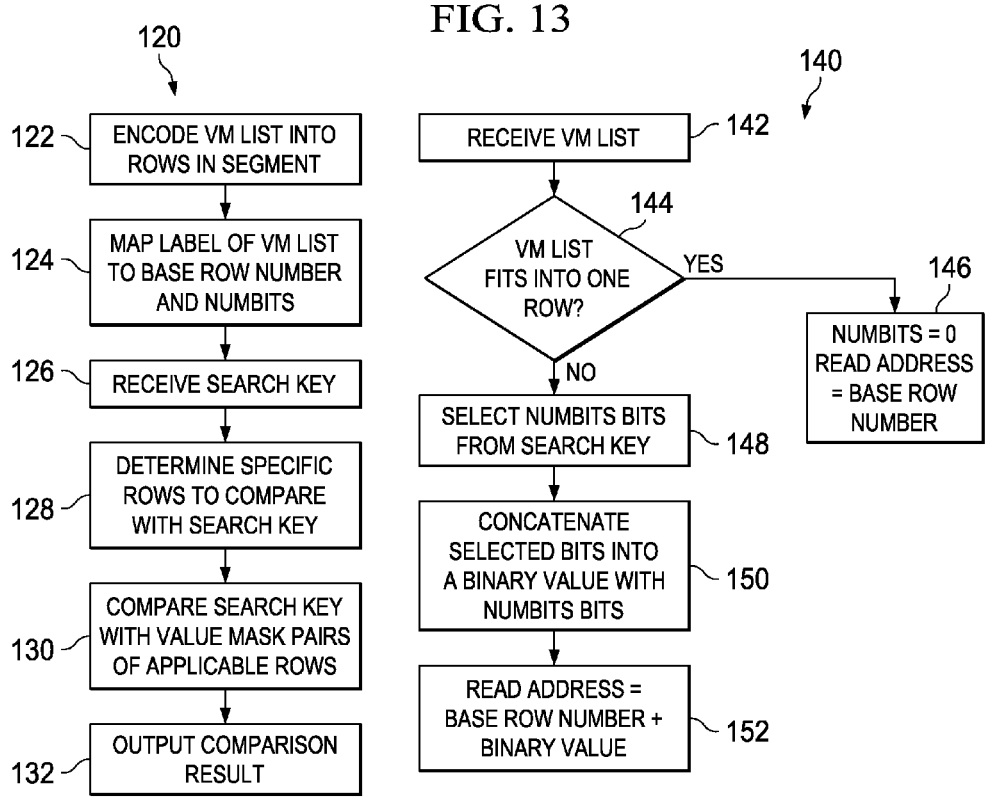

| HASHING LEVEL | HASH TABLE (PREFIX BITS) | USED BY PREFIXES (OF LENGTH) |
| --- | --- | --- |
| 0 | HT_0 (0..7) | ANY PREFIX WITH LEN > = 8 |
| 1 | HT_1 (1..8) | 9 |
| | HT_2 (2..9) | 10 |
| | HT_3 (3..10) | 11 |
| | HT_4 (4..11) | 12 |
| | HT_5 (5..12) | 13 |
| | HT_6 (6..13) | 14 |
| | HT_7 (7..14) | 15 |
| | HT_8 (8..15) | ANY PREFIX WITH LEN > = 16 |
| 2 | HT_9 (9..16) | 17 |
| | HT_10 (10..17) | 18 |
| | HT_11 (11..18) | 19 |
| | HT_12 (12..19) | 20 |
| | HT_13 (13..20) | 21 |
| | HT_14 (14..21) | 22 |
| | HT_15 (15..22) | 23 |
| | HT_16 (16..23) | ANY PREFIX WITH LEN > = 24 |
| 3 | HT_17 (17..24) | 25 |
| | HT_18 (18..25) | 26 |
| | HT_19 (19..26) | 27 |
| | HT_20 (20..27) | 28 |
| | HT_21 (21..28) | 29 |
| | HT_22 (22..29) | 30 |
| | HT_23 (23..30) | 31 |
| | HT_24 (24..31) | 32 |

FIG. 22

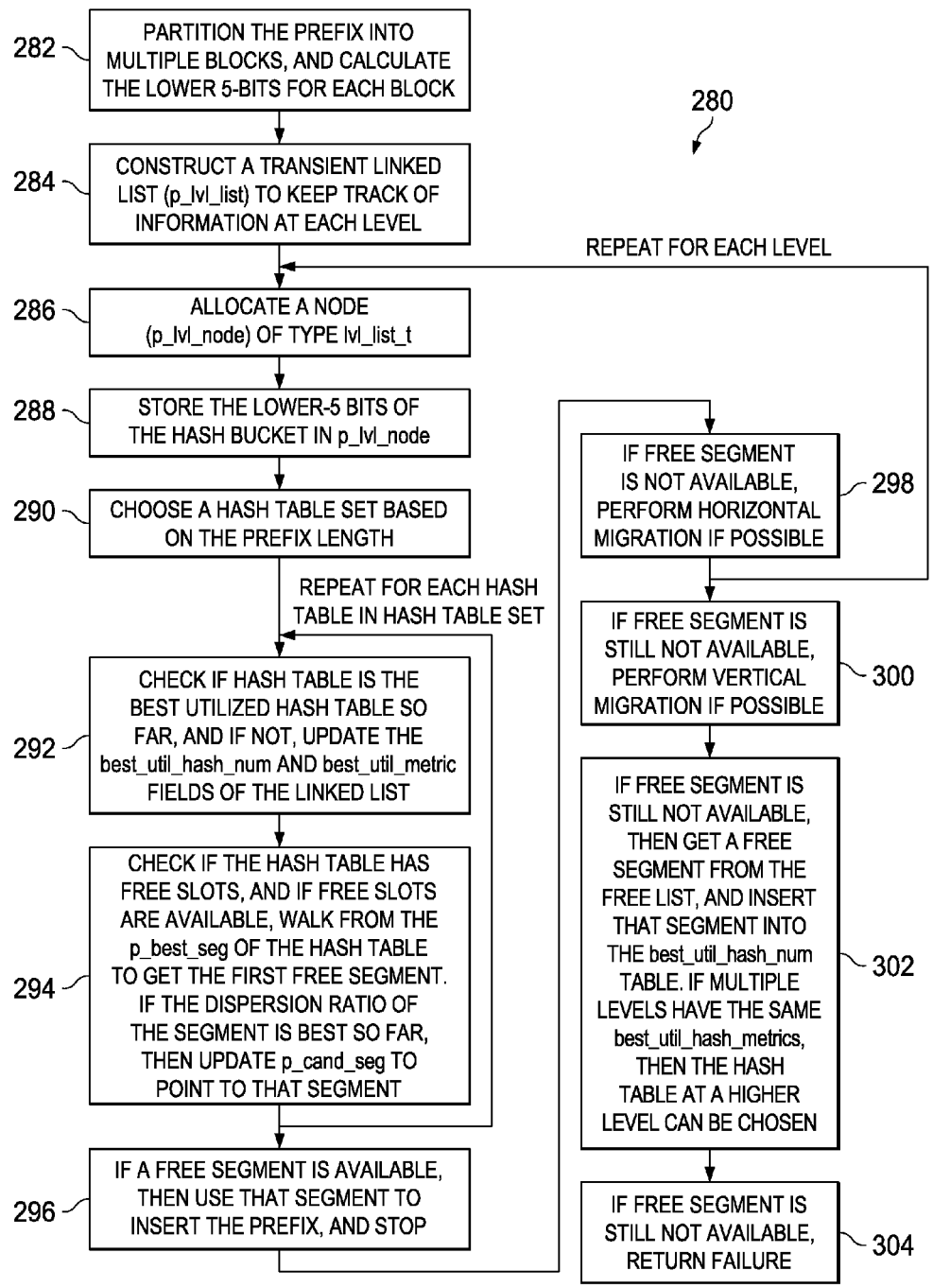

| NUMBER OF VRF = 50 NUMBER OF PATTERNS 47 | NUMBER OF VRF = 1 NUMBER OF PATTERNS 25 | NUMBER OF VRF = 1000 NUMBER OF PATTERNS 25 | NUMBER OF VRF = 1000 NUMBER OF PATTERNS 25 |
|---|---|---|---|
| {0x01000000, 8, 10}, | {0x01000000, 8, 10}, | {0x01000000, 8, 40}, | {0x01000000, 8, 30}, |
| {0x02000000, 9, 15}, | {0x11000000, 9, 20}, | {0x02000000, 9, 40}, | {0x02000000, 9, 30}, |
| {0x14000000, 10, 30}, | {0x21000000, 10, 30}, | {0x14000000, 10, 40}, | {0x13000000, 10, 30}, |
| {0x1e000000, 11, 30}, | {0x29000000, 11, 30}, | {0x1e000000, 11, 40}, | {0x1e000000, 11, 30}, |
| {0x32000000, 12, 30}, | {0x33000000, 12, 30}, | {0x32000000, 12, 40}, | {0x32000000, 12, 30}, |
| {0x37000000, 13, 30}, | {0x34000000, 13, 30}, | {0x37000000, 13, 40}, | {0x37000000, 13, 30}, |
| {0x41000000, 14, 30}, | {0x35000000, 14, 30}, | {0x41000000, 14, 40}, | {0x41000000, 14, 30}, |
| {0x4b000000, 15, 30}, | {0x36000000, 15, 100}, | {0x4b000000, 15, 40}, | {0x4b000000, 15, 30}, |
| {0x55000000, 16, 30}, | {0x37000000, 16, 20}, | {0x55000000, 16, 40}, | {0x55000000, 16, 30}, |
| {0x5f000000, 17, 30}, | {0x38000000, 17, 50}, | {0x5f000000, 17, 40}, | {0x5f000000, 17, 30}, |
| {0x69000000, 18, 30}, | {0x39000000, 18, 10000}, | {0x69000000, 18, 40}, | {0x69000000, 18, 30}, |
| {0x73000000, 19, 30}, | {0x40000000, 19, 10000}, | {0x73000000, 19, 40}, | {0x73000000, 19, 30}, |
| {0x7d000000, 20, 30}, | {0x41000000, 20, 10000}, | {0x7d000000, 20, 40}, | {0x7d000000, 20, 30}, |
| {0x87000000, 21, 30}, | {0x43000000, 21, 10000}, | {0x87000000, 21, 40}, | {0x87000000, 21, 30}, |
| {0x91000000, 22, 30}, | {0x44000000, 22, 10000}, | {0x91000000, 22, 40}, | {0x91000000, 22, 30}, |
| {0x9b000000, 23, 30}, | {0x45000000, 23, 100000}, | {0x9b000000, 23, 40}, | {0x9b000000, 23, 30}, |
| {0xc0000000, 24, 205}, | {0x46000000, 24, 200000}, | {0xc0000000, 24, 40}, | {0xc0000000, 24, 30}, |
| {0xc1000000, 25, 30}, | {0x47000000, 25, 100000}, | {0xc1000000, 25, 40}, | {0xc1000000, 25, 30}, |
| {0xc2000000, 26, 30}, | {0x48000000, 26, 50000}, | {0xc2000000, 26, 40}, | {0xc2000000, 26, 30}, |
| {0xc3000000, 27, 30}, | {0x49000000, 27, 50000}, | {0xc3000000, 27, 40}, | {0xc3000000, 27, 30}, |
| {0xc4000000, 28, 30}, | {0x50000000, 28, 50000}, | {0xc4000000, 28, 40}, | {0xc3000000, 28, 30}, |
| {0xc5000000, 29, 30}, | {0x51000000, 29, 50000}, | {0xc5000000, 29, 40}, | {0xc5000000, 29, 30}, |
| {0xc6000000, 30, 30}, | {0x52000000, 30, 50000}, | {0xc6000000, 30, 40}, | {0xc6000000, 30, 30}, |
| {0xc7000000, 32, 30}, | {0x53000000, 31, 50000}, | {0xc7000000, 31, 40}, | {0xc7000000, 31, 30}, |
| {0x0a000000, 9, 60}, | {0x54000000, 32, 50000} | {0xc8000000, 32, 40} | {0xc8000000, 32, 30} |
| {0x28000000, 10, 60}, | | | |
| {0x3c000000, 11, 60}, | | | |
| {0x46000000, 12, 120}, | | | |
| {0x50000000, 13, 240}, | | | |
| {0x5a000000, 14, 240}, | | | |
| {0x64000000, 15, 240}, | | | |
| {0x82000000, 16, 240}, | | | |
| {0x8c000000, 17, 240}, | | | |
| {0x96000000, 18, 240}, | | | |
| {0xa0000000, 19, 240}, | | | |
| {0xaa000000, 20, 240}, | | | |
| {0xb4000000, 21, 240}, | | | |
| {0xbe000000, 22, 240}, | | | |
| {0xbf000000, 23, 240}, | | | |
| {0xc0a80000, 24, 580}, | | | |
| {0xc2aa0000, 25, 240}, | | | |
| {0xc4000000, 26, 240}, | | | |
| {0xc4b40000, 27, 240}, | | | |
| {0xc8000000, 28, 120}, | | | |
| {0xcd000000, 29, 120}, | | | |
| {0xd4d50000, 30, 120}, | | | |
| {0xdcd60000, 32, 500} | | | |
| 310 | 312 | 314 | 316 |

| SAMPLE | CONSECUTIVE (WHEN SEGMENTS ARE ALLOCATED IN PAIR) | RANDOM (WHEN SEGMENTS ARE ALLOCATED IN PAIR) |
|---|---|---|
| SET 1 (3 VRF, 25K IN TOTAL) | 76% (66%) | N/A |
| SET 2 (50 VRF EACH WITH 6K) | 87% (80%) | 94% (93%) |
| SET 3 (1VRF, 800K) | 99% (99%) | 97% (96%) |
| SET 4 (1000 VRF, EACH WITH 25x40) | 79% (67%) | 96% (94%) |
| SET 5 (1000 VRF, EACH WITH 25x30) | 90% (91%) | 96% (96%) |

| SAMPLE | CONSECUTIVE (WHEN SEGMENTS ARE ALLOCATED IN PAIR) | RANDOM (WHEN SEGMENTS ARE ALLOCATED IN PAIR) |
|---|---|---|
| SET 1 (3 VRF, 25K IN TOTAL) | < 0 (<0) | N/A |
| SET 2 (50 VRF EACH WITH 6K) | 4 (7) | 20 |
| SET 3 (1VRF, 800K) | 33 | 69 (104) |
| SET 4 (1000 VRF, EACH WITH 25x40) | 346 (497) | 364 (509) |
| SET 5 (1000 VRF, EACH WITH 25x30) | 32 (24) | 287 (262) |

| SAMPLE | CONSECUTIVE (WHEN SEGMENTS ARE ALLOCATED IN PAIR) | RANDOM (WHEN SEGMENTS ARE ALLOCATED IN PAIR) |
|---|---|---|
| SET 1 (3 VRF, 25K IN TOTAL) | 1.6K (2.1K) | N/A |
| SET 2 (50 VRF EACH WITH 6K) | 76K (42K) | 22K |
| SET 3 (1VRF, 800K) | 20 | 22K (23K) |
| SET 4 (1000 VRF, EACH WITH 25x40) | 27K (25K) | 27K (15K) |
| SET 5 (1000 VRF, EACH WITH 25x30) | 93K (87K) | 1K (3K) |

| SAMPLE | NUMBER OF SEGMENTS AVAILABLE | NUMBER OF SEGMENTS ACTUALLY USED | ENTRIES MOVED | TIME TAKEN (IN SECONDS) | UTIL |
|---|---|---|---|---|---|
| SET 1 (3 VRF, 25K IN TOTAL) | 188 (CAPACITY FOR 48K) | 188 | 1072 | < 1 | 99% |
| SET 2 (50 VRF EACH WITH 6K) | 3906 (1 MILLION CAPACITY) | 1317 | 59155 | 2 | 100% |
| SET 3 (1VRF, 800K) | 3906 (1 MILLION CAPACITY) | 3145 | 20 | 345 | 100% |
| SET 4 (1000 VRF, EACH WITH 25x40) | 3906 (1 MILLION CAPACITY) | 3906 | 19096 | 366 | 75% |
| SET 5 (1000 VRF, EACH WITH 25x30) | 3906 (1 MILLION CAPACITY) | 3413 | 68178 | 21 | 100% |

FIG. 26E

| SAMPLE | NUMBER OF SEGMENTS AVAILABLE | NUMBER OF SEGMENTS ACTUALLY USED | ENTRIES MOVED | TIME TAKEN (IN SECONDS) | UTIL |
|---|---|---|---|---|---|
| SET 1 (3 VRF, 25K IN TOTAL) | 188 (CAPACITY FOR 48K) | 184 | 3077 | < 1 | 100% |
| SET 2 (50 VRF EACH WITH 6K) | 3906 (1 MILLION CAPACITY) | 1432 | 60847 | 3 | 100% |
| SET 3 (1VRF, 800K) | 3906 (1 MILLION CAPACITY) | 3154 | 90 | 36 | 100% |
| SET 4 (1000 VRF, EACH WITH 25x40) | 3906 (1 MILLION CAPACITY) | 3906 | 25718 | 487 | 67% |
| SET 5 (1000 VRF, EACH WITH 25x30) | 3906 (1 MILLION CAPACITY) | 3386 | 47207 | 15 | 100% |

FIG. 26F

SYSTEM AND METHOD FOR PACKET CLASSIFICATION AND INTERNET PROTOCOL LOOKUP IN A NETWORK ENVIRONMENT

TECHNICAL FIELD

This disclosure relates in general to the field of communications and, more particularly, to a system and a method for packet classification and Internet Protocol (IP) lookup in a network environment.

BACKGROUND

The communications industry is rapidly changing to accommodate emerging technologies and ever increasing customer demand. Customer demand for new applications and increased performance of existing applications are driving communications network and systems providers to use networks and systems having greater speed and capacity. In particular, routers and switches that typically forward data packets within and between networks, face increasingly high performance demands. Routers perform packet classification and IP lookups to forward data packets based on information categories, network configurations and other considerations. In addition, routers may perform admission control, firewall and intrusion detection, policy based routing, resource reservation, per-flow queuing, and various other functions. The various functionalities of the router, coupled with growing network demand, drive a need for faster throughput, higher efficiency, better performance router configurations.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 2B is a simplified diagram illustrating other example details associated with an embodiment of the communication system;

FIG. 5 is a simplified pseudo code illustrating example operations that may be associated with an embodiment of the communication system;

FIG. 6 is a simplified pseudo code illustrating other example operations that may be associated with an embodiment of the communication system;

FIG. 7 is a simplified pseudo code illustrating other example operations that may be associated with an embodiment of the communication system;

FIG. 11 is a simplified pseudo code illustrating other example operations that may be associated with an example embodiment of the communication system;

FIG. 12 is a simplified block diagram illustrating yet other example details that may be associated with an embodiment of the communication system;

FIG. 13 is a simplified diagram illustrating yet other example details that may be associated with an embodiment of the communication system;

FIG. 16 is a simplified flow diagram illustrating example operations that may be associated with embodiments of the communication system;

FIG. 17 is a simplified flow diagram illustrating other example operations that may be associated with embodiments of the communication system;

FIG. 22 is a simplified diagram illustrating yet other example details that may be associated with an embodiment of the communication system;

FIG. 25 is a simplified flow diagram illustrating other example operations that may be associated with an embodiment of the communication system; and FIGS. 26A to 26F are simplified diagrams illustrating yet other example details that may be associated with embodiments of the communication system.

DETAILED DESCRIPTION OF EXAMPLE EMBODIMENTS

Overview

An example method for packet classification and IP lookup in a network environment includes partitioning a memory element of a router in a network environment into a plurality of segments with one or more rows, where at least a portion of the one or more rows is encoded with a value mask (VM) list including a plurality of values and masks. The VM list may be identified by a label. The method further includes mapping the label to a base row number and a specific number of bits corresponding to the portion encoding the VM list, identifying the label in a search key, determining a read address of a specific row in the portion, and comparing the search key with the plurality of values and masks in the specific row. In specific embodiments, the partitioning is according to buddy memory allocation and other features.

Another example method includes partitioning a prefix into a plurality of blocks, where each block includes a particular selection of bits in the prefix, and indexing to a hash table using a value of a specific block. A bucket of the hash table corresponds to a segment of a ternary content addressable memory of a router in a network environment. The method further includes storing the prefix in a row of the segment. In various embodiments, the value may indicate a read address of the row. The TCAM can include a plurality of segments, with each segment having a plurality of rows, where each row is configured to store a single prefix. The method can further include adding another bucket corresponding to another segment to include another prefix, and other features.

Example Embodiments

Figures 1, 2A:
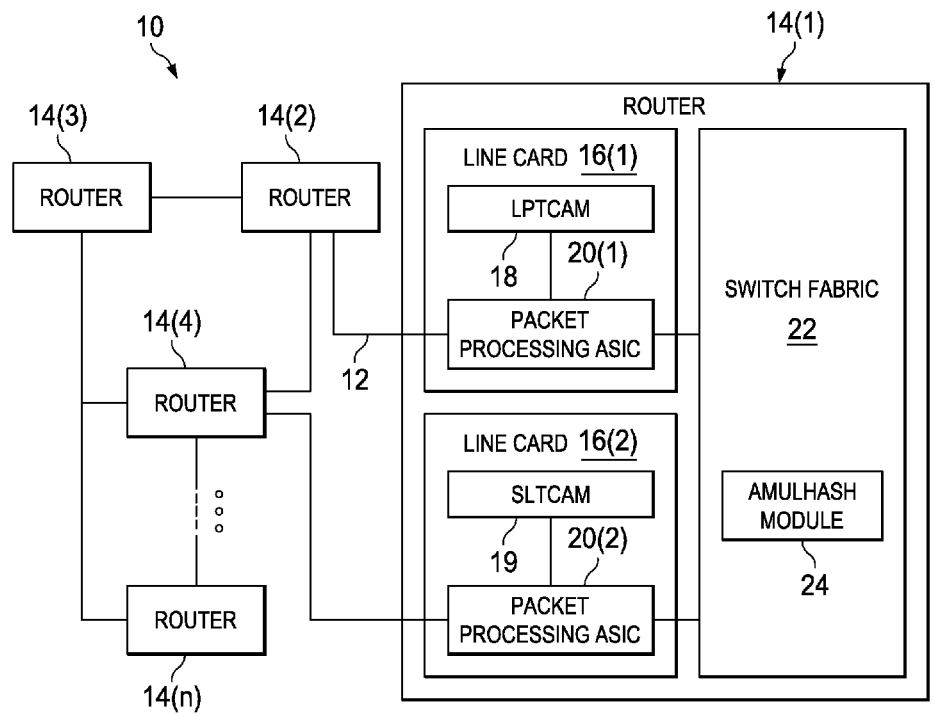
FIG. 1 is a simplified block diagram illustrating a communication system for packet classification and IP lookup in a network environment.
FIG. 2A is a simplified diagram illustrating example details associated with an embodiment of the communication system.

Turning to FIG. 1, FIG. 1 is a simplified block diagram illustrating a communication system 10 for packet classification and IP lookup in a network environment. Communication system 10 includes a network 12 (generally indicated by an arrow) comprising various routers 14(1)-14(n). A representative router 14(1) includes one or more line cards, for example, line cards 16(1) and 16(2). Line card 16(1) can include one or more Label-Partitioned Spans Logic Ternary Content Addressable Memory (LPTCAM) 18. Line card 16(2) can include one or more SpansLogic TCAM (SLTCAM) 19. Each line cards 16(1) and 16(2) can include one or more packet processing Application Specific Integrated Circuits (ASICs), for example, packet processing ASIC 20(1) and 20(2), respectively. In various embodiments, LPTCAM 18 may perform packet classification and SLTCAM 19 may perform IP lookup. A switch fabric 22 may control line cards 16(1) and 16(2). An Adaptive Multilevel Hashing (AMULHASH) module 24 may control IP lookup of SLTCAM 19.

Example LPTCAM 18 and SLTCAM 19 are illustrated in FIG. 1 merely for ease of illustration. In various embodiments, router 14(1) may include only one of either LPTCAM 18 or SLTCAM 19, or may include both LPTCAM 18 and SLTCAM 19. Moreover, in some embodiments, both LPTCAM 18 and SLTCAM 19 may be configured in a single line card. In other embodiments, they may be configured in different line cards, as illustrated in the FIGURE.

For purposes of illustrating the techniques of communication system 10, it is important to understand the communications that may be traversing the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

In a typical router, implementing features such as access control lists (ACLs), Quality of Service classification (QoS), policy based routing (PBR), and longest prefix match of a packet's destination IP address in a forwarding information base (FIB), can involve classifying a packet during packet forwarding, based on certain values in specific packet header fields. Generally, packet classification starts with a user configuration, where a user (e.g., router operator, network administrator, etc.) configures the router with applicable classification criteria (e.g., rules). There are many methods for implementing packet classification. In typical high-speed routers, the classification step is often implemented using Ternary Content Addressable Memory (TCAM). With TCAM, the user configuration, usually consisting of a list of packet classification rules, called a rules list, is transformed by suitable software into a list of value-mask (VM) pairs, called a VM list. The primary advantages of TCAMs over other approaches include high rate, low latency, and deterministic performance for search operations. Moreover, TCAM capacity, in terms of number of classification entries, is deterministic and easily explained to the users. The primary disadvantages of TCAMs are their higher cost and power relative to other available packet classification solutions.

The TCAM consists of many identical hardware (e.g., memory) elements called entries that store the VMs. Each entry may store a portion of a VM list. For example, a specific VM list can include VMs that are concatenated into 160 bits. The TCAM can be configured with virtually any desired entry size, depending on the hardware limitations (e.g., memory size) of the TCAM. The TCAM takes a search key as a query, and returns the address of the entry, if any, that contains the search key. Each data bit of the TCAM entry is capable of storing one of three states: 0, 1, or * (wildcard), where a * matches both 0 and 1.

The number and size of VM lists that can be simultaneously configured in a traditional TCAM can depend merely on the number of VMs in the VM lists (e.g., as any VM can be written into any entry), and not, for example, on any particular sequence of the VMs ordered in the VM list. Thus, to know whether a particular VM list can fit into a traditional TCAM, the VMs may be counted, and if it is less than or equal to the number of TCAM entries, the VMs can fit in the TCAMs.

Turning to the TCAM operation, when a packet is ready to be classified during the forwarding process, the packet processing ASIC may extract relevant packet header fields from the packet corresponding to the packet classification rules, form the packet header fields into a search key (e.g., 160 bit search key), and send the search key to the TCAM. The search key is broadcast to all entries in the TCAM, each of which calculates independently, and in parallel with the other entries, whether the search key matches the VM stored therein. For example, each entry calculates a condition (e.g., search key AND mask=value) and produces a "match" or "no match" result.

When the packet classification rules include priority (e.g., certain rules to be processed before other rules apply), the match results are placed in a priority encoder, which determines a first matching entry with the smallest entry number and outputs the entry number of the first matching entry. In addition, a separate bit called "hit" indicates whether any match was found (hit=1), or no match was found (hit=0).

TCAMs can occupy a large space in the memory element partly due to each entry having its own comparison logic. Moreover, the TCAM's high power requirements can be attributed to each entry doing its own comparison on every search key.

For policy-based features, the packet classification rules can change over time (e.g. by commands from a human operator). When such changes are made, a packet should be either classified according to the old packet classification rules before the change is made, or according to the new packet classification rules after the change is made. The packet cannot be simultaneously classified according to both the old and new packet classification rules. The old and new packet classification rules may be similar, or completely different from each other. The router should correctly implement the "either the old rules list or the new rules list" criterion regardless of the contents of the old and new packet classification rules.

Moreover, packet classification rules for policy-based features for more than one policy may be stored in the same TCAM device. To classify the packet according to the relevant rule list of the corresponding policy feature (and not according to rule lists of other policy features, which are stored in the same TCAM), a certain portion of the search key is reserved to identify the specific rule list to be searched. The portion of the search key that identifies the specific rule list to be searched is called a "label." For example, if a TCAM's capacity is to be shared among up to 1024 different rule lists, 10 bits (=$\log_2$ 1024) may be dedicated to the label. Every VM installed in the TCAM may have all of the bits of the label field with mask equal to 1, i.e. those bit positions of the search key may match the corresponding bits in the VM substantially exactly.

To explain further, a single TCAM may contain a particular VM list (e.g., VM list 1) for ACL classification of packets that arrive at the router on input interface number 1, and all of the VMs in VM list 1 have a label value of 15. The TCAM may also contain another VM list (e.g., VM list 2) for ACL classification of packets that arrive at the router on input interface number 2, all with label 8.

When a packet arrives at the router, the router looks up the label that should be used for the ACL classification of the packet, for example, in a table that maps the label with the input interface. The label is included as part of the search key sent to the TCAM when the packet is classified for the ACL feature, along with field values extracted from the packet. Because the VMs in the TCAM for other features and/or other input interfaces have different label values, none of such VMs can match the search key, and may return a no-hit result. Any method may be used to select the label values to use for a particular VM list, as long as the label values selected are different for each VM list.

Turning back to the "either the old rules list, or the new rules list" criterion, a common technique to implement the criterion is a "make before break" method. For example, suppose the router operator decides that instead of a current ACL (e.g., ACL 1) applied to input interface 1, a new ACL (e.g., ACL 2) should be used instead. In the "make before break" method, the router performs all the operations required to construct the new VM list corresponding to new ACL 2 and writes it into the TCAM (e.g., populates the entries of the TCAM with the VM list). The router may use a new label value (e.g., label 22) that is currently not in use. During this "make" time, packets are still being processed using the old ACL 1.

In the "break" step, the table that maps input interfaces to labels may be re-written with the new label 22 corresponding to input interface 1, replacing the old label 15. The TCAM entries with label 15 are still in the TCAM, but after the change, they will no longer match any packets from input interface 1.

After a brief period of time, all packets that had the old label value of 15 would have exited out of the router. After all packets with the old label value have exited the router, the TCAM entries with label 15 can be reused for other purposes. However, not all potential applications of a TCAM may fit into such make and break approach. For example, if a TCAM is used for longest prefix matching of IP destination addresses, the set of TCAM entries is typically modified one entry at a time while continuing to be used for forwarding packets.

Packet classification may be implemented using another method called SpansLogic TCAM (SLTCAM). SLTCAM consists primarily of static random access memory (SRAM) for storing VM lists, and custom ASIC logic that performs a comparison between search keys and VM lists, as opposed to a traditional TCAM, which uses an array of TCAM entries.

The primary advantages of SLTCAM over traditional TCAM are lower cost and power for a same search rate. SLTCAM maintains the traditional TCAM's advantages of a fast deterministic search rate and low latency. The SLTCAM reduces the memory element area by storing VMs in a more area-efficient memory technology than TCAM, such as an SRAM. In addition, the SLTCAM implements comparison logic once for each RAM. These changes also result in lower power per search.

At a high level, the building block of classification in SLTCAM is a "segment." Each segment consists of a fixed number (e.g., 256) of entries, also referred to as "rows." Each row comprises at least one value and mask. The rows are grouped together such that a certain set of bits in the group is unique. Each such identified group is then placed in a segment. The unique set of bits that is applicable to all rows in the segment is called "bit select."

The matching logic for classifying VMs into segments in the SLTCAM operates as follows: given a VM list, determine if all of the VMs can be divided into sets not exceeding the number of segments in the SLTCAM (e.g., 1024 or fewer). For each of the sets, the bit select may be determined. For example, the bit select may be 8-bit positions such that all VMs in the set differ in those 8-bit positions, and none of the 8-bit positions contain any wildcard bits.

If the bit select for a set of VMs can be found, then the selected VMs can be stored in the same segment of the SLTCAM, using the bit select to select from search keys and form a RAM read address. Each segment is programmed by control software with its own bit select (e.g., set of 8-bit positions). For example, a segment may be programmed to use bit positions 5, 28, 60, 61, 99, 102, 110, and 113 out of a 160-bit search key.

The bit selection logic of the SLTCAM extracts the bit select from every search key and concatenates them together to form an 8-bit address to read from the RAM comprising the segments. Once a row from a segment is matched, a segment wide mask (called segment mask register) is applied to the search key and compared with the VMs in the row for a complete match.

The process is done in parallel across all segments and the "winner" row is picked based on priority associated with the row in each segment. The search key is checked to see if it matches the value and mask exactly as in a TCAM, i.e. (search key AND mask=value). The hit bit value output by the segment indicates whether the search key matched, and the priority value from the row is also output. Each segment that found a matching row has its priority values compared with other priority values, and the row with the smallest read address is output as the overall result for the entire SLTCAM search operation.

The output from the SLTCAM consists of a value, mask, and a priority value. The value and mask are the same size as in the TCAM, whereas the priority value is typically the smallest read address of the matching row in the SLTCAM. For example, if the SLTCAM consists of 1024 segments of 256 VMs each, for a total of 256K VMs, the priority would be the base 2 logarithm of 256K, or 18 bits in size. The priority value is used in place of a matching entry number, simply because in the SLTCAM, the position where a VM is written is restricted by the SLTCAM's operation, but it is typically desired to produce the same "address of first matching entry" output value that a TCAM produces.

Adding a new set of VMs to an existing state of the SLTCAM can involve temporarily duplicating some VMs, (e.g., storing them in two segments at once) and removing the old VMs. In some cases, it could also require temporarily misclassifying packets while some VMs are removed to make rooms for new ones in their places, before the old ones are stored elsewhere.

Implementing policy-based features in SLTCAM is similar to TCAMs. VMs can be stored in any row, as long as VMs that have the same label are placed in the proper priority order relative to each other (i.e. VMs with higher priority are stored in rows with a smaller row number than VMs with lower priority). The total number of rows can be divided up arbitrarily between different labels.

A collection of rule lists can be simultaneously configured on the SLTCAM as long as the total size (in units of VMs) fits within its capacity. Moreover, when making configuration changes, sufficient empty space may be considered in the SLTCAM before the change to hold the new rule list's VMs, so that the "make before break" technique can work.

To explain further, consider an example wherein at most 255 small rules are to be encoded into the SLTCAM that has 1024 segments, and each segment contains 256 entries. Assume that every row is flexible enough to contain any VM pair. If the rule lists are transformed into VM lists with 1024 VMs or less, and only 256−1=255 rule lists are configured in the SLTCAM simultaneously, and if the router software only uses the values 0 through 255 for labels, then every SLTCAM segment can be configured to select the 8 bits of the label value from the search key. Because every segment is configured to select the 8 bits of the label, when a search key with label 0 is sent to the SLTCAM, every segment will read entry 0 in its 256-entry RAM.

Subsequently, every segment will check whether the search key matches the value/mask read from entry 0. If the search key matches, the segment outputs hit=1 and the priority of the matching entry. If the search key does not match, the segment outputs hit=0 and the priority value will be ignored. The SLTCAM may calculate the minimum value among all priorities output from segments with hit=1 (if any), and output that minimum priority.

If the SLTCAM has no restrictions on the mask values that may be used, up to 1024 VMs may be written in the 1024 segments at RAM address 0, using priority values in the range 0 through 1023 (smaller values indicate higher priority). The SLTCAM can operate similar to a 1024-entry traditional TCAM for search keys with label 0.

The same is true for search keys with label X, except that all VMs must be written at address X within each of the RAMs, for any value of X from 0 through 255. Thus, when an SLTCAM is configured so that every segment selects the 8 bits of label in the search key, each of its 256 rows behaves similar to a 1024-entry traditional TCAM, independent of the other rows.

However, if more than 255 rules are to be encoded in the SLTCAM and none of them can have more than 1024 VMs, other configuration changes may be in order. For example, the label value may be increased to greater than 8 bits, for example, 13 bits. Only 8 of them would be used to select the address to read in each segment. The other 5 bits would serve to distinguish different VM lists that share space in the same row.

For example, if the most significant 8 bits of a 13-bit label were selected in each segment, then label values 0 through 31 would all share space in row 0, labels 32 through 63 would all share space in row 1, etc. Thus, two VM lists whose total size is at most 1024 VMs can be given labels 0 and 1 and both their VMs would be placed in row 0.

Thus, the SLTCAM can be encoded with up to 8919 VM lists (8192 less 1 left unused for the make-before-break technique), each at most 1024 VMs long, and such that groups of up to 32 of the VMs have a size of at most 1024 VMs. However, such a configuration may not meet predictability, order-independence and guaranteed utilization properties. Moreover, it is restricted to rules lists with at most 1024 VMs in each list.

In a general sense, there is no deterministic capacity for storing VMs in SLTCAMs. VMs can only be placed in certain restricted places, depending upon the particular bit patterns in the VMs. Thus, the capacity of the SLTCAM can be data-dependent. For example, a particular VM list may fail to fit into the SLTCAM in one sequence, whereas it may fit if placed in a different sequence.

SLTCAM architecture may involve an area versus flexibility tradeoff. Smaller segment sizes make SLTCAM more flexible and more similar to a TCAM, but more expensive in area and power. Larger segment sizes make the SLTCAM less expensive in area and power, but less flexible. For example, a desired set of VMs cannot be programmed into the SLTCAM at all, or can be programmed, but with low efficiency (e.g., poor utilization, leading to several empty rows).

In some SLTCAM implementations, rather than storing a full mask (e.g., 160 bit mask) in each row, the area may be reduced further, at the cost of less flexibility in the way rows may be stored, by storing a "compressed mask" that is smaller than the full mask, and combining the compressed mask with a small amount of configuration data in the segment to produce a full mask. In other SLTCAM implementations, arbitrary port ranges may be encoded in a single one of the 256 RAM rows, with corresponding more complex matching logic.

Desirable properties of the TCAM and SLTCAM include predictability, order independence, and guaranteed utilization. Predictability in transforming packet classification rules into VM lists can help determine whether a collection of rule lists can fit into the same TCAM. If a particular collection of rule lists fits into a TCAM once, then as long as the hardware and software do not change, the same collection of rule lists should fit every time, regardless of a sequence of configuration commands, or rebooting of the router. The same collection should also fit if it is configured on a different router with the same hardware and software.

With guaranteed utilization, some percentage of a TCAM's entries can always be filled up without any possibility of a configuration failure due to a "not enough TCAM capacity available" error, irrespective of the specific packet classification rules. For example, a guaranteed utilization of 50% would mean that if at most 50% of a TCAM's entries are in use before a configuration change is made, and if after a "make before break" sequence at most 50% of the TCAM's entries would be in use, then the configuration change almost always succeeds.

A typical TCAM can operate to achieve predictability, order-independence, and guaranteed utilization, with 100% guaranteed utilization. Traditional TCAMs, besides having the advantages of deterministic performance and latency, can also achieve predictability, order-independence, and guaranteed utilization with minimal software configuration efforts.

However, with the SLTCAM, depending upon the software algorithms used to choose the search key bits to select in each segment, a specific set of packet classification rules may fit when applied in a specific sequence, but may not fit when applied in a different sequence. Restricting SLTCAM configuration algorithms to avoid this behavior can involve rewriting most or all of the segments, which can cause delays and errors in packet classification.

Moreover, unlike the TCAM, where almost any packet classification rules and corresponding VM lists can be accommodated, the SLTCAM configuration algorithms may not be able to find a configuration for which the SLTCAM can classify correctly, leading to denying the rule change request. While it is possible to write SLTCAM control algorithms that achieve order-independence, such algorithms may require "starting over" with writing the hardware state from scratch, during which time the packet classification would not be performed according to the configured VM lists. There are no known ways to write SLTCAM control software to achieve predictability, or guaranteed utilization.

Turning to IP lookup, prefix lookup involves packet classification according to prefix lists. As used herein, the term "prefix" indicates a portion of an IP address (e.g., 192.9.205.22). The two most common versions of IP addresses in use are Internet Protocol version 4 (IPv4) and Internet Protocol version 6 (IPv6). The IPv4 address space is 32-bits in size and the IPv6 address space is 128-bits in size.

In general, the IP address contains a network prefix and a host identifier. The network prefix indicates the number of significant bits used to identify a network. For example, the IP address 192.9.205.22 /18 indicates that the first 18 bits are used to represent the network and the remaining 14 bits are used to identify hosts.

As used herein, the term "prefix list" can include a named list of prefixes. Prefix lists operate similar to ACLs, except that prefix lists apply to prefixes only. In other words, prefix lists are a special case of ACLs. In general, ACLs cannot check for the subnet mask (e.g., network prefix) of a network. On the other hand, the prefix list can check both bits and subnet mask (e.g., both bits and subnet mask have to match for the packet to be either permitted or denied access to the network).

For example, the prefix list containing 172.16.8.0/24 would check the 24 bits of an IP address in a packet from left to right and ensure that it matches a 24-bit subnet mask. Both the 24 bits checked and the 24-bit subnet mask should match for network access to be permitted or denied to the packet.

SLTCAM management software may have to ensure that a given prefix list that has been transformed into a corresponding VM list is analyzed (e.g., compiled) to select the bit-select. The SLTCAM management software may program appropriate rows in the respective segments accordingly.

Current mechanisms used in the SLTCAM include B-sort and W-sort techniques. B-sort, which is an off-line, passive technique, identifies the best segment to fit in the requested prefix based on segment utilization and availability metrics for a set of pre-selected bit-selects. B-sort technique is fast, but may not always result in the best utilization.

W-sort, which is an online, active technique, may actively derive the best bit-selects for the given set of VMs, and attempt to compact the entries in the best possible manner to improve the utilization. W-sort technique is time and compute intensive, but can likely result in a better utilization than the B-sort technique. The W-sort algorithm can be triggered on demand, based on threshold values (in terms of utilization).

There are multiple problems with the B-sort and W-sort techniques. For example, for high scale scenarios (e.g., 900K prefixes), the algorithms take a long time (in the order of minutes). On the other hand, for low scale scenarios (e.g., 32K prefixes), the utilization is poor (e.g., around 50%) for some configuration sets. Moreover, even for the same prefix list, inserted in the same order, the algorithm takes variable amount of time for lookup at different times. Routes inserted in different order could result in different behavior in terms of time taken and utilization.

The W-sort algorithm tries to build a tree out of a subset of prefixes (which are stored in least utilized segments) and to derive the bit selects for these prefixes. The algorithm can be extremely complex and poorly implemented. The performance of the algorithm is purely based on the data sets. For example, because the algorithm does not maintain any state information for all prefixes, but constructs a decision tree at run-time, the time consumed for the lookup is directly dependent on the data set (e.g., prefix list) under analysis.

An alternate solution that can be effective and efficient is to hash the prefix using known hashing techniques (e.g., FNV, Jenkins, Murmur3, etc.), or custom hashing techniques, and to index into the segments with the hash value. For platforms that cannot significantly accommodate changes to hardware to incorporate hashing algorithms, or cannot implement hashing, a solution which may not be as efficient as hashing but can offer better performance (in terms of update time, utilization, and predictability) compared to current architecture, may be needed.

Communication system 10 is configured to address these issues (and others) in offering a system and method for packet classification and IP lookup in a network environment. Embodiments of communication system 10 can partition memory elements of LPTCAM 18 into a plurality of segments having one or more rows, and encode ACLs represented by corresponding VM lists into the one or more rows. Each VM list may be represented by a specific label. In various embodiments, the label may be mapped to a combination of a base row number and a specific number of bits ("numbits") corresponding to the rows that encode the VM list.

Other embodiments of communication system 10 may partition a prefix into a plurality of blocks at AMULHASH module 24, and index to a hash table using a value of a specific block. The hash table may include a bucket corresponding to a segment of SLTCAM 19 (or a regular TCAM) of router 14(1). The prefix may be stored in a row of the segment, with the value indicating a read address of the row. The hash table may be logically represented as rows of entries from multiple segments forming a hash bucket. Each segment may be viewed as a column of entries. In other words, when a segment is added to the hash table, a column of 256 entries may be added to the hash table, with each entry assigned to one bucket. For example, a 256-entry segment can represent 256 buckets.

Turning back to LPTCAM 18, embodiments of communication system may partition the memory elements of router 14(1) according to the labels associated with specific VM lists. For example, router 14(1) may be configured with 10 different VM lists. Label 1 may be allocated the first two rows of the segments in LPTCAM 18. Label 2 may be allocated the last 128 rows of the segments and Label 3 may be allocated the middle 8 rows of the segments.

The base row number indicates the start of the rows corresponding to the label, and the numbits indicates how many bits (or rows) are used up consecutively by the specific policy indicated by the label. For example, label 1 may be indexed to base row number of 0 and numbits of 1, indicating that the first row number and $2^1$ consecutive rows are used by the VMs associated with label 1. In another example, label 2 may be indexed to base row number of 128 and numbits of 7, indicating that the 128th row number and $2^7=128$ subsequent consecutive rows are used by the VMs associated with label 2.

During operation, a packet-entering router 14(1) may be processed to extract values in specific packet header fields of the ACL under analysis. In various embodiments, the extraction may be performed by packet processing ASIC 20(1). The values in the specific packet header fields may be concatenated into a search key.

The search key may be fed to segments in the LPTCAM 18 along with the base row number and numbits corresponding to the label of the VM list under analysis. LPTCAM 18 may compare the search key to the VM pairs stored in the rows (identified by the base row number and numbits) and output search results, indicating whether any of the encoded VM lists match the packet header values of the packet.

According to various embodiments, LPTCAM 18 may be configured to retain advantages of deterministic search rate and latency of SLTCAMs, while avoiding at least some of the disadvantages. In particular, LPTCAM 18 can achieve the predictability and order-independence properties, with a guaranteed utilization of at least 50%. In some embodiments, LPTCAM 18 may allow for multiple search results for each search key. In some other embodiments, LPTCAM 18 may allow for compression to accommodate huge VM lists (e.g., with a large number of VMs). In yet other embodiments, LPTCAM 18 may allow for selection of rows (and corresponding bits) according to a decision tree.

Turning to the infrastructure of communication system 10, the network topology can include any number of servers, virtual machines, switches (including distributed virtual switches), routers, and other network nodes inter-connected to form a large and complex network. A "network node" may be any electronic device, client, server, peer, service, application, or other object capable of sending, receiving, or forwarding information over communications channels in a network. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs.

Communication system 10 may include a configuration capable of TCP/IP communications for the electronic transmission or reception of data packets in a network. Communication system 10 may also operate in conjunction with a User Datagram Protocol/Internet Protocol (UDP/IP) or any other suitable protocol, where appropriate and based on particular needs. In addition, gateways, routers, switches, and any other suitable nodes (physical or virtual) may be used to facilitate electronic communication between various nodes in the network.

The example network environment may be configured over a physical infrastructure that may include one or more networks and, further, may be configured in any form including, but not limited to, local area networks (LANs), wireless local area networks (WLANs), VLANs, metropolitan area networks (MANs), wide area networks (WANs), VPNs, Intranet, Extranet, any other appropriate architecture or system, or any combination thereof that facilitates communications in a network.

In some embodiments, a communication link may represent any electronic link supporting a LAN environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), telephone lines, T1 lines, T3 lines, wireless, satellite, fiber optics, cable, Ethernet, etc. or any combination thereof) and/or through any additional networks such as a wide area networks (e.g., the Internet). Network 16 may represent any type of networks, including Internet, enterprise networks, cloud networks, etc.

In various embodiments, routers 14(1)-14(N) may include switches, routers, and other network elements that can interconnect one or more nodes within a network (e.g., network 12). In general, routers 14(1)-14(N) include appropriate hardware and software to enable them to inspect packets, determine the source and destination devices of the packets, and forward the packets appropriately. The term "switch" and "router" may be interchangeably used in this Specification to refer to any device that can receive, process, and forward packets in a network.

In various embodiments, LPTCAM 18 may be implemented in hardware, for example, in line card 16(1). In other embodiments, some portions of LPTCAM 18 may be implemented in hardware, and other portions may be implemented in software in line card 16(1). For example, some operations described herein may be implemented in hardware in a data plane of line card 16(1), and other operations may be implemented in hardware and software in a control plane of line card 16(1).

In yet other embodiments, some portions of LPTCAM 18 may be implemented in line card 16(1), and other portions of LPTCAM 18 may be implemented in switch fabric 22. For example, data plane operations associated with LPTCAM 18 may be implemented in line card 16(1), and control plane operations associated with LPTCAM 18 may be implemented in switch fabric 22.

In various embodiments, AMULHASH module 24 may be implemented in hardware, for example, in line card 16(2). In other embodiments, some portions of AMULHASH module 24 may be implemented in hardware, and other portions may be implemented in software in line card 16(2). For example, some operations described herein may be implemented in hardware in a data plane of line card 16(2), and other operations may be implemented in hardware and software in a control plane of line card 16(2).

In yet other embodiments, some portions of AMULHASH module 24 may be implemented in line card 16(2), and other portions of AMULHASH module 24 may be implemented in switch fabric 22. For example, any data plane operations associated with AMULHASH module 24 may be implemented in SLTCAM 19 of line card 16(2), and control plane operations associated with AMULHASH module 24 may be implemented in switch fabric 22.

Although LPTCAM 18, SLTCAM 19, AMULHASH module 24 and other elements are illustrated in detail in router 14(1) only, it may be understood that these and other components may be included in one or more of the other routers 14(2)-14(N). Moreover, these elements may be included in any other network element, as appropriate and based on suitable configuration needs.

Turning to FIG. 2A, FIG. 2A is an example list of ACLs according to an embodiment of communication system 10. Table 26 illustrates a rules list including four ACLs showing example parameters that may be included in the ACLs. Example table 26 illustrates merely a few representative examples of ACLs. Virtually any measurable parameter and combination of parameters may be used to construct the rule lists within the broad scope of the embodiments.

The example rule list may include the following packet header fields: protocol, source IP address, source port, destination IP address, and type of service. According to the values in the packet header fields, the rule may specify an action (e.g., permit, deny).

A packet may be classified according to the example rule list as follows: if packet matches ACE 1, then perform action corresponding to ACE 1, else if packet matches ACE 2, then perform action corresponding to ACE 2, else if packet matches ACE 3, then perform action corresponding to ACE 3, and so on, until if packet does not match any ACE in the list, then perform a default action.

For the example rule list of Table 26, the packet matches ACE 1 if all of the following conditions are true: the field called 'protocol' in its header is equal to 6; its source IP address is any 32-bit value that matches 128.252.169.* (e.g., the most significant 3 bytes match the values 128, 252, and 169, but the least significant byte can be any value, denoted in the rule by an asterisk); its source port can be any value; its destination IP address is any 32-bit value that matches 10.0.*.*. (e.g., the most significant 2 bytes must be 10 and 0, but the least significant 16 bits can be any value); its destination port is equal to 25; and its type of service can be any value. If any of those conditions is not true, then the packet does not match ACE 1, so the next ACE in the rule list may be checked, and so on.

Rules such as the example rules presented in Table 26 can be implemented by calculating a value and a mask, such that if the relevant packet header fields are concatenated together to form the search key, then the packet matches the value and mask if the bitwise AND of the search key and the mask is equal the value. For example, a 32-bit source IP address from the packet would match the 128.252.169.* part of ACE 1 exactly when the IP address AND-ed with the 32-bit mask 255.255.255.0 is equal to the 32-bit value 128.252.169.0.

Turning to FIG. 2B, FIG. 2B illustrates a list of value-mask pairs that correspond to the ACLs illustrated in FIG. 2A. The 4 ACEs in Table 26 can each be implemented with a corresponding value/mask pair, as shown in table 27. For example, ACE 1 can be represented by values {6, 128.252.169.0, 0, 10.0.0.0, 25,0} corresponding to mask {255, 255.255.255.0, 0, 255.255.0.0, 65535, 0}.

Example ACE 3 of table 27 cannot be implemented with a single value/mask pair, but it can be implemented with two value/mask pairs, shown as VM number 3 and 4 in table 27. VM 3 matches packets with a source port in the range 256 through 511, inclusive, and VM 4 matches packets with a source port in the range 512 through 1023, inclusive. Taken together, if a packet matches ACE 3, then it can match either VM number 3 or VM number 4.

According to embodiments of communication system 10, router 14(1) may include appropriate hardware and software to convert the rules list of table 26 to the value/mask pairs of table 27. FIGS. 2A and 2B illustrate example rules and corresponding value/mask pairs using which LPTCAM 18 may be appropriately programmed. Virtually any packet header field parameters and combinations thereof may be implemented in the rules within the broad scope of the embodiments. Moreover, the representation illustrated in table format in FIGS. 2A and 2B is merely for ease of illustration, and should not be considered to be limitations of any embodiment of communication system 10.

Figure 3:
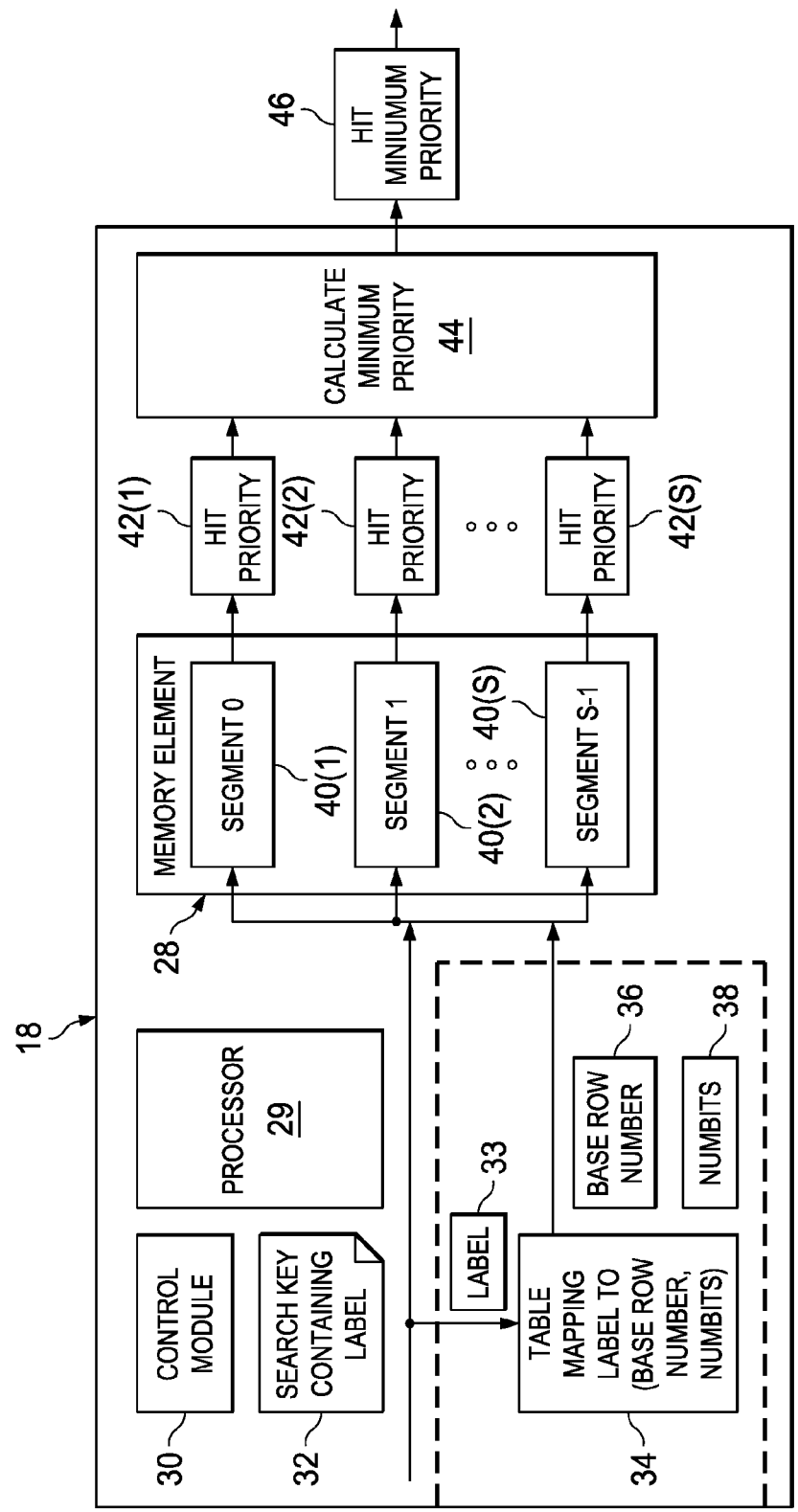
FIG. 3 is simplified block diagram illustrating example details of an embodiment of the communication system.

Turning to FIG. 3, FIG. 3 is a simplified block diagram illustrating example details of an embodiment of communication system 10. Representative LPTCAM 18 (in representative router 14) includes a memory element 28, a processor 29, and a control module 30. A search key 32 may contain a label 33 corresponding to the specific ACL being processed. For example, ACL associated with interface 1 may have label 33 with a value of 15. Another ACL associated with interface 2 may have label 33 with a value of 8. A table 34 may be provisioned in LPTCAM 18 to map label 33 to a base row number 36 and numbits 38.

Control module 30 may be a software implementation in the respective line card (e.g., representative line card 16), in some embodiments. In other embodiments, control module 30 may be a hardware implementation in the respective line card. In yet other embodiments, control module 30 may be implemented on a control plane of the respective line card. In yet other embodiments, control module 30 may be implemented in a switch fabric of the router having LPTCAM 18. In still other embodiments, control module 30 may be part of management software that can configure the router. Various other implementations of control module 30 are possible within the broad scope of the embodiments.

In a general sense, control module 30 may control configuration of LPTCAM 18. In one example, control module 30 may partition memory element 28 into segments 40(1)-40(S) according to buddy memory allocation. In another example, control module 30 may cause table 34 to be indexed by label 33.

For each label 33, table 34 may include base row number 36 in a range from 0 to R−1 (where R is the number of rows in each segment 40(1)-40(S) of LPTCAM 18), and numbits 38 in a range from 0 to j (where j is the number of bits to be selected from search key 32). LPTCAM 18 may include several (e.g., S) segments 40(1)-40(S) to process search key 32. Each of segments 40(1)-40(S) may include one or more rows. For example, each segment 40(1), 40(2), ... 40(S) may include R number of rows. The rows may include values and masks according to the ACLs programmed in LPTCAM 18.

During operation, search key 32 may be received by LPTCAM 18. Label 33 may be extracted from search key 32 and used to read base row number 36 and numbits 38 from table 34. Base row number 36 and numbits 38 can indicate the row numbers (e.g., numbit rows starting from base row number) to read in each of segments 40(1)-40(S) corresponding to the specific VMs of the VM list having the value in label 33.

Search key 32, base row number 36 and numbits 38 may be received by segments 40(1)-40(S). Segments 40(1) ... 40(S) may each compare search key 32 with value, mask and priority combinations of the rows specified by base row number 36 and numbits 38. Segments 40(1) ... 40(S) may subsequently output comparison results 42(1) ... 42(S), respectively.

Each comparison result 42(1)-42(S) may indicate a combination of hit (e.g., hit=0 indicates no match; hit=1 indicates a match) and priority based on comparing the search key to values and masks in the applicable rows of corresponding segment 40(1)-40(S). Comparison results 42(1) ... 42(S) may be processed by a module 44 that calculates a minimum priority for matching hits (e.g., hit=1) and outputs a final comparison result 46 having a hit and minimum priority.

For example, a specific ACL for interface 1 may have a value of 15 for label 33. The ACL may have a corresponding VM list with specific value and mask pairs corresponding to packet header fields protocol, source IP address, source port, destination IP address, destination port, and type of service. The VM list may be encoded in specific rows of segments 40(1)-40(S). For example, the VM list may be encoded in rows numbered 2 to 4 in segments 40(1)-40(S).

Table 34 may be configured to point label value 15 to a combination of 2 and 2 corresponding, respectively, to base row number 36 and numbits 38. When a packet enters representative router 14, search key 32 may be generated from values in the packet header fields, corresponding to the fields in the ACL with label value 15.

Search key 32, and the values 2 and 2 corresponding to base row number 36 and numbits 38, respectively, may be fed to segments 40(1)-40(S). Segments 40(1)-40(S) may compare search key 32 with values and masks in rows 2 through 4, and output comparison results 42(1)-42(S), respectively.

Module 44 may select the matching hit with the minimum priority and output that as final comparison result 46. According to various embodiments, LPTCAM 18 can be configured to fit any number of VM lists in any sequence, similar to a traditional TCAM operation, and with the advantages of the SLTCAM, including increased speed, reduced size and lower power consumption.

In many embodiments, LPTCAM 18 may implement buddy memory allocation for all VM lists, both small and large. For example, control module 30 may partition memory element 28 into segments 40(1)-40(S) according to buddy memory allocation. "Buddy memory allocation" refers, in a general sense, to a memory allocation algorithm that divides memory into partitions to satisfy a memory request as suitably as possible. Specifically, memory is split into halves to get a best-fit.

Various forms of the buddy memory allocation may be implemented within the broad scope of the embodiments. In binary buddy memory allocation, each memory block is subdivided into two smaller blocks. Every memory block has an order, where the order is an integer ranging from 0 to a specified upper limit. The blocks in each order have sizes proportional to $2^{order}$, so that each block is exactly twice the size of blocks that are one order lower.

Power-of-two block sizes can simplify address computation because all blocks are aligned on memory address boundaries that are powers of two. For example, if a new policy comes in that needs 4 rows, buddy memory allocation may require that the policy be encoded in a row starting at a multiple of 4, for example, 0, 4, 8, and so on. With buddy memory allocation, a smaller number of rows may be moved to allow the new policy to be allocated in a contiguous memory space. Buddy memory allocation can simplify compaction when necessary to make a contiguous region of space free in the hardware for the new VM list.

According to various embodiments that implement buddy memory allocation, segments 40(1)-40(S) may be divided j times into $2^j$ rows to accommodate j bit positions that are unique to a specific segment and differ between segments 40(1)-40(S). According to some embodiments, any number of rows that is a power of 2 may be fitted into segments 40(1)-40(S).

The VM list may be divided into $2^j$ consecutive rows, X through $X+2^j-1$, where the VMs may be divided into at most S sets (corresponding to the number of segments 40(1)-40 (S)), where each set has at most $2^j$ VMs. For each set of VMs, j bit positions may be found such that every pair of VMs in the set differs in those j bit positions (and have no wildcard bit positions at the j bit positions).

Each segment 40(1)-40(S) may select j bits from the search key (with the bit positions being configurable for each segment independent of the other segments), and treat the j bits as a j-bit integer (numbits 38) to add to the base row number X (base row number 36), resulting in a row number in the range X through $X+2^j-1$. In other words, the rows encoding the VM list may be in the range from base row number 36 to base row number $36+2^{numbits}-1$.

For example, assume that LPTCAM 18 includes 1024 segments (e.g., S=1024), and 1025 VMs are to be placed in segments 40(1)-40(1024). It may not be possible to fit the VM list with 1025 VMs into a single row in each segment 40(1)-40(1024). However, it may be possible to fit the 1025 VMs into two rows, with a total storage capacity of 2*1024=2048 VMs.

Two consecutive rows, say X and X+1, may be used to place the 1025 VMs. X may be indicated by base row number 36. Each segment 40(1)-40(1024) may still read a single row from its RAM for a single search, so each segment may decide between reading entry X or X+1. The decision may be made by selecting numbits 38 (equal to 1 bit, in the example) from search key 32, and adding the value of the selected bit to base row number 36 (e.g., value X).

According to an example embodiment, a VM list 1 with label 7 may occupy 2 rows (e.g., 0 through 1), another VM list 2 with label 10 may occupy 4 rows (e.g., 12 through 15), and yet another VM list 3 with label 8 may occupy 16 rows (e.g., 48 through 63). With buddy memory allocation, however, the VM list occupying $2^j$ rows may be restricted to start in base row number 36 that is a multiple of $2^j$. Partitioning up a memory space of LPTCAM 18 into separate regions for each label value enables predictability and order-independence, among other features.

According to various embodiments, the value of numbits 38 can be 0 for labels with small VM lists (e.g., VM lists that fit entirely within one row of any specific segment, such as segment 40(1)). In such a case (e.g., with small VM lists), the value of base row number 36 may be used to read the specific row in segments 40(1)-40(S). Segments 40(1)-40(S) need not select any bits from search key 32 to calculate a row address.

If numbits 36 is 1 or larger, then a plurality of bits may be selected from search key 32, concatenated into a binary value with a number of bits (equal to the value of numbits 36), and added to base row number 36 to get a read address for the specific row to read in each segment. The bits positions selected may be independently configurable for different base row number 36.

For example, if 128 VM lists are configured in LPTCAM 18, each occupying two rows, with base row number 36 having values 0, 2, 4, 6, . . . 254 (e.g., even numbers from 0 through 254), then each segment 40(1)-40(S) can configure a specific bit position to select for row number 0, another bit position to select for row number 2, and so on. In general, up to 256/2=128 such bit positions can be configured inside each segment 40(1)-40(S).

In some embodiments, elements of LPTCAM 18 may be implemented in, and may form an integral part of, memory element 28. For example, segments 40(1)-40(S) may be implemented in memory element 28. In other embodiments, various elements of LPTCAM 18 may be implemented apart from memory element 28, and may access and use memory element 28 as needed, based on particular configuration settings.

In some embodiments, processor 29 may be an integral part of LPTCAM 18, for example, implemented in hardware along with the other elements. In other embodiments, elements of LPTCAM 18 may access processor 29 in line card 16.

Figure 4:
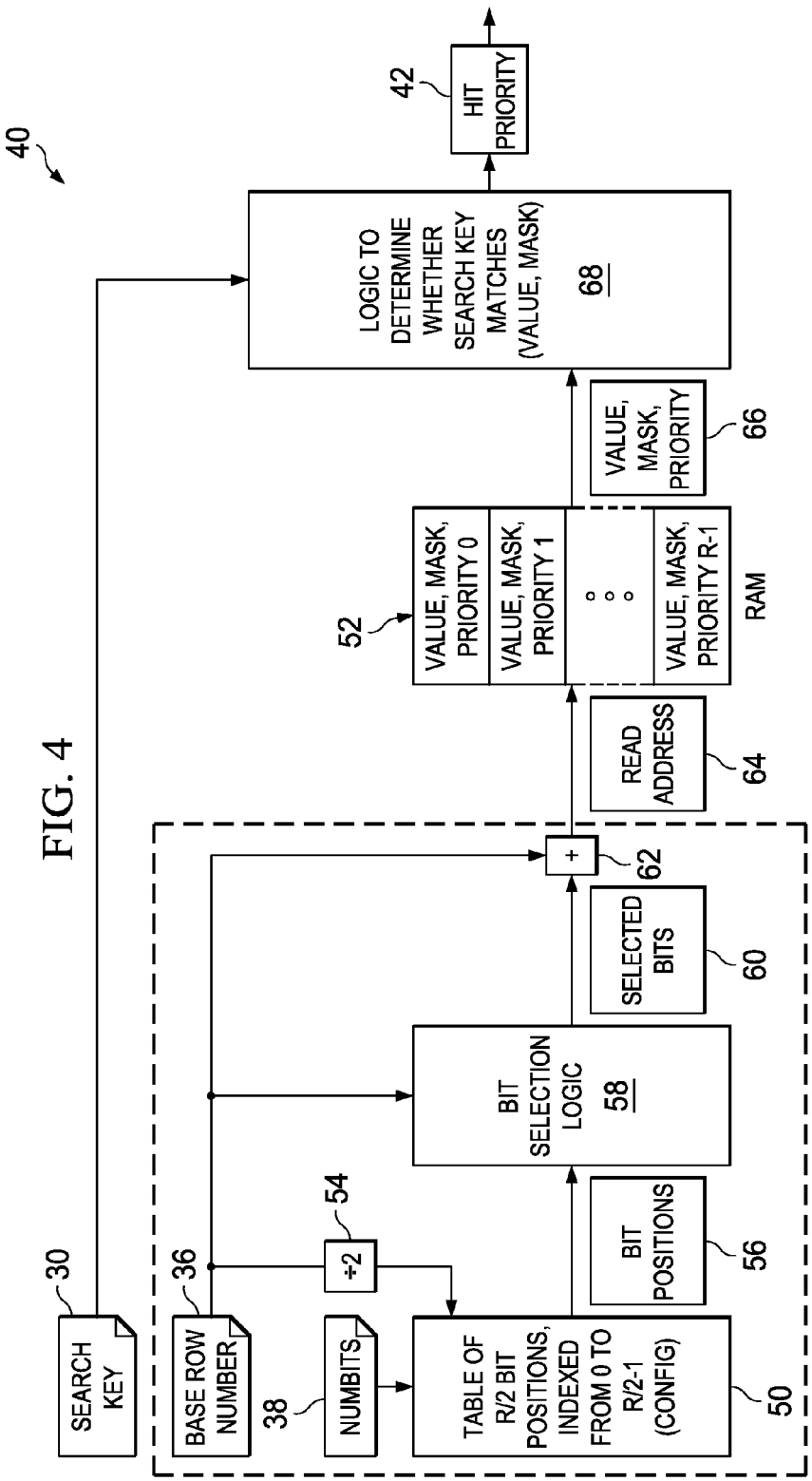
FIG. 4 is simplified block diagram illustrating other example details of an embodiment of the communication system.

Turning to FIG. 4, FIG. 4 is a simplified block diagram illustrating example details of representative segment 40 in LPTCAM 18 according to an embodiment of communication system 10. Segment 40 may include a table 50 including R/2 bit positions, where R is the total number of rows 52 in segment 40. Table 50 may be indexed from 0 to R/2-1. In various embodiments, control module 50 may implement buddy memory allocation in table 50.

Segment 40 may include a plurality of rows 52 comprising value, mask, and different priority values (e.g., 0 to R−1). In various embodiments, rows 52 may be implemented in a random access memory (RAM) of memory element 28 in LPTCAM 18. Additional mappings and tables to obtain the read address may be implemented within the broad scope of the embodiments.

During operation, segment 40 may receive as inputs search key 32, base row number 36 and numbits 38. Base row number 36 may be divided by 2 at module 54, and the resulting value used in table 50 as an index of a first bit position to use. A total of numbits consecutive values may be used from table 50 to generate bit positions 56 to select from search key 32.

Bit selection logic 58 may select bits from search key 32 at bit positions 56 to generate selected bits 60. Module 62 may add base row number 36 to selected bits 60 to generate a read address 64 (e.g., 8 bits in size for a segment with 256 rows). The row corresponding to read address 64 may be selected, and a value, mask, priority set 66 corresponding to the row at read address 64 may be sent to module 68.

Module 68 may include logic to determine whether search key 32 matches value, mask, priority set 66. A comparison result 42 may be generated from the comparison. For example, comparison result 42 may indicate a hit=0 (e.g., no match), or a hit=1 (match), and corresponding priority value.

In an example embodiment, assume that base row number 36 is 128, and numbits is 7, and two search keys 32(1) and 32(2) are being analyzed. Search keys 32(1) and 32(2) may differ in their bit values. For each base row number 36 (divided by 2), an entry in table 50 may indicate bit positions 56 to select from search key 32. Selected bits 60 may be concatenated to a binary value (say 20), which may be added to base row number 36, to give 148 as read address 64, and search key 32(1) may be compared to the VMs at row 148.

Another search key 32(2) may be received at segment 40, for the same base row number 36 (e.g., 128) and numbits 38 (e.g., 7). However, because the values in search key 32(2) may be different from previous search key 32(1), concatenated value of selected bits 60 may be 100 (rather than 20), indicating a read address 64 of 228. Thus, although the same VM list is being compared with search keys 30(1) and 30(2), because the values of search keys 30(1) and 30(2) are different, different rows may be read for appropriate packet classification.

Turning to FIG. 5, FIG. 5 is a simplified example pseudo code 70 illustrating example operations associated with calculating VM allocation according to buddy memory allocation schemes in an example embodiment of communication system 10. Pseudo code 70 calculates an arbitrarily named function round_up_to_power_of2( ) which takes as input, a value j.

A variable i is initially set to 1. While i is less than j, variable i may be incremented to 2 times its previous value. The increment may be continued until i reaches a maximum value less than j. The final incremented value is returned by the function as a value of j that is the nearest rounded up to a power of 2.

Turning to FIG. 6, FIG. 6 is a simplified example pseudo code 72 illustrating example operations that may be associated with calculating the fewest number of rows 52 to fit VM list L according to an embodiment of communication system 10. Variable R may denote a total number of rows 52 (e.g., 256) in each segment.

Function VM_list_fits_in_i_rows( ) in pseudo code 72 may be a deterministic function of L and counter i. Counter i may be initially set to 2. Starting with 2, and incrementing by 2*i until the maximum number of rows 52 (i.e., R) is reached, the VMs may be attempted to fit into i number of rows. If the VMs fit into i number of rows, the function returns the value of counter i and exits. If the VMs do not fit into all R rows, then, a failure may be declared, for example, the VMs may not fit into LPTCAM 18 at all.

Turning to FIG. 7, FIG. 7 is a simplified example pseudo code illustrating example operations that may be associated with an embodiment of communication system 10. A hardware size for LPTCAM 18 can be calculated according to pseudo code 74. Pseudo code 74 defines a function named, arbitrarily, as hardware_size( ) which can vary with input L, the VM list to populate in LPTCAM 18. Variable S can denote the number of segments (e.g., 1024).

The output of function hardware_size( ) is H, the hardware size to allocate to VM list L. If size (L), which is the number of VMs in list L, is less than or equal to the number of segments, the VM list can fit into a single row, or a fraction of a row. Consequently, the hardware size may be the size of the VM list, rounded up to the next larger power of 2, as calculated using function round_up_to_power_of_2(size(L)) according to pseudo code 70.

On the other hand, if the size of L is greater than number of segments, the VM list may need more than 1 row (e.g., at least 2 rows). Larger VM lists, even two that have exactly the same number of VMs as each other, may have different hardware sizes depending upon the particular values and masks in the VM lists. The hardware size may be S×fewest_power_of_2_rows(L), calculated according to pseudo code 72.

In the various embodiments, the hardware size may be the same for a particular rule list, irrespective of the sequence of VMs therein, so that if a particular rule list fits at one time, the rule list will fit again at another time, and require no more hardware space than before. In some embodiments, any improvements of the function may be accommodated from one software version to the next (e.g., to avoid any rule list getting a larger hardware size) by running both the older and newer functions, and using the smaller of the two hardware sizes computed.

Guaranteed utilization of 50% can be achieved when substantially all VM lists are small, because the hardware size may be at most 2 times the number of VMs. The hardware size may be data dependent for large VMs, and if the VM list meets certain conditions (e.g., fit into rows 52 in LPTCAM 18), LPTCAM 18 can achieve 50% guaranteed utilization.

The utilization can degrade below 50% if VM lists are configured with hardware size more than 2 times the number of VMs. In such scenarios, router operators may be notified on a per-rule list basis, so that the router operator can determine the specific rule lists causing the utilization degradation.

Figures 8, 9:
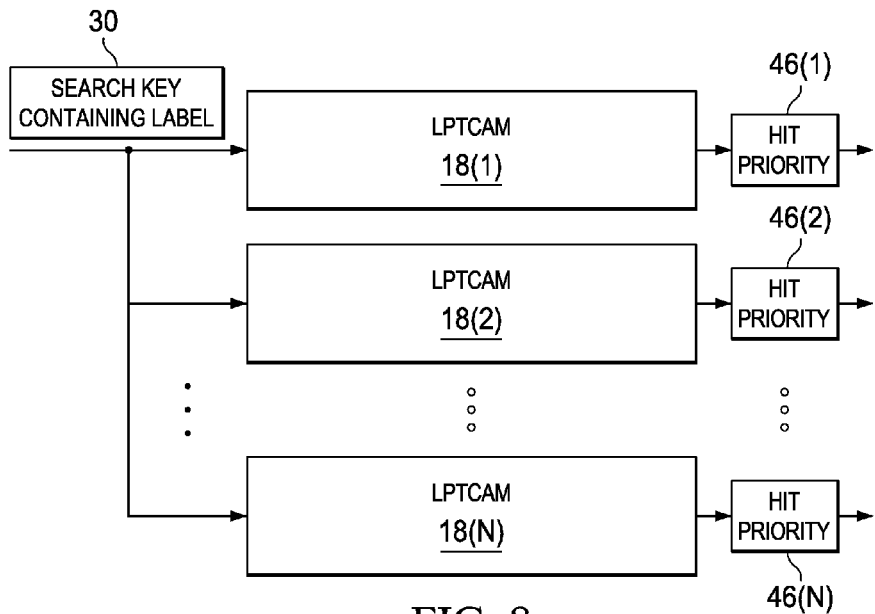
FIG. 8 is a simplified block diagram illustrating yet other example details of an embodiment of the communication system.
FIG. 9 is a simplified diagram illustrating example details that may be associated with an embodiment of the communication system.

Turning to FIG. 8, FIG. 8 is a simplified block diagram illustrating another example embodiment of communication system 10. According to the example embodiment, communication system 10 can provide for multiple comparison results 46(1)-46(N) for each search key 32. The example embodiment can include a plurality of LPTCAMs 18(1)-18(N).

The plurality of LPTCAMs 18(1)-18(N) may be implemented on a single device and can hold multiple independent collections of VM lists, each with their own independent address space of label values. The device can be sent a single search key 32, which may be searched in parallel in LPTCAMs 18(1)-18(N), each returning a separate comparison result 46(1)-46(N), respectively.

Each comparison result 46(1)-46(N) can indicate a different {hit, minimum matching priority} combination. The plurality of LPTCAMs 18(1)-18(N) may implement a separate table to map label values to base row number 36 and numbits 38 for each collection of VM lists in the device.

Turning to FIG. 9, FIG. 9 is an example table illustrating an example VM list according to an embodiment of communication system 10. According to an embodiment of communication system 10, a VM list that can fit into multiple rows 52 need not necessarily occupy a number of rows 52 that is a power of 2; rather, the VM list may occupy any integer number of rows 52.

Such an example embodiment may have additional configuration state and logic, and use more area in a hardware implementation. An example application of the embodiment is for a VM list that requires more than half the rows 52 of LPTCAM 18 (e.g., LPTCAM 18 has 256 rows, and the VM list cannot be configured using 128 rows). For example, the large VM list may use only 240 rows 52 (e.g., in LPTCAM 18 having 256 rows 52 in each segment 40), leaving 16 rows 52 for other VM lists to be stored in LPTCAM 18.

If a VM list has 256×1024 VMs, it cannot fit into fewer than 256 rows 52 in LPTCAM 18 having 1024 segments. However, if the VM list has 240×1024 VMs, it may fit into 240 rows 52, but may not fit into 128 rows 52. In general, the VM list may be permitted to occupy an integer number of rows 52 that is not a power of 2 under the following conditions: (1) the VM list may be divided into sets numbering at most the number of segments 40(1)-40(S) in LPTCAM 18 (e.g., 1024 sets), (2) substantially every one of the sets can be programmed into one segment (e.g., segment 40(1)) (in other words, there is a collection of j bit positions such that every pair of VMs in the set differs in those j bit positions, and the VMs have no wildcard bit positions in those j positions), and (3) substantially every set contains at most Y VMs, where Y is any integer. If the conditions are substantially satisfied, the VM list may be collected into Y rows, rather than $2^j$ rows.

When substantially every set contains at most Y VMs, at most Y possible values would be used when matching search key 32. Embodiments of communication system 10 can independently compress the value of the j selected bit positions in each segment 40 into a densely populated range of compressed values 0 through Y−1, the compressed value may be added to base row number 36 to produce an address in a smaller range X through X+Y−1, and thus only use Y rows 52 of LPTCAM 18 instead of $2^j$ rows.

Table 76 provides an example of such an embodiment, using a VM list with 11 entries where the values and masks are 5 bits wide. The value of numbits 38 is 3, as three bit positions are extracted from the VMs in each segment. The example VMs are in a single 5-character sequence, where * represents a wildcard bit position (mask=0, such that search key 32 with any value in that bit position can match), 0 represents a bit position where search key 32 is 0 for a match (mask=1 and value=0 for that bit position), and 1 represents a bit position where search key 32 is 1 for a match (mask=1 and value=1 for that bit position).

The bit positions may be numbered to extract with 0 as the rightmost bit position, and increasing to the left. Thus, example VM 01**1 has a 1 in bit positions 0 and 3, a 0 in bit position 4, and * in bit positions 1 and 2. The bit positions extracted from each VM are shown underlined for emphasis.

In example table 76, LPTCAM 18 has 2 segments, with 8 rows each. Segment 0 has 5 VMs in the 8 rows, and segment 1 has 6 VMs in the 8 rows. According to various embodiments, the extracted bit values may be compressed to the compressed values shown, and the VM list can be configured to use only 6 rows, the largest number of VMs in any of the segments.

Each segment may perform the compression differently from other segments. For example, each segment may have its own set of Y values to compress, different from other segments. An array of R bits in each segment (e.g., R being the number of rows) may be stored as a "segment bit array." The bit for a row, say row "r," may be equal to 1 if there is a VM to be stored in the row, and otherwise it is 0. The column labeled "Seg. bit array" in table 76 shows the values of the segment bit array for the example VMs provided.

The compressed value for row r may be equal to the sum of all segment bit array values in rows 0 through r−1. The segment bit array in each segment may be stored with corresponding values written by control software. Each segment may use digital logic to calculate the sum of all bits in the array in positions 0 through r−1 when the bits from search key 32 are extracted to form uncompressed value r.

The sum is the compressed value, which is then used as the index into the table of value/mask/priorities instead of the row number r. For example, compressed value 4 for segment 0 indicates that it is the fourth non-empty row, corresponding to VM 11101; compressed value 4 for segment 1 indicates that it is the fourth non-empty row, corresponding to VM 1110.

Figure 10:
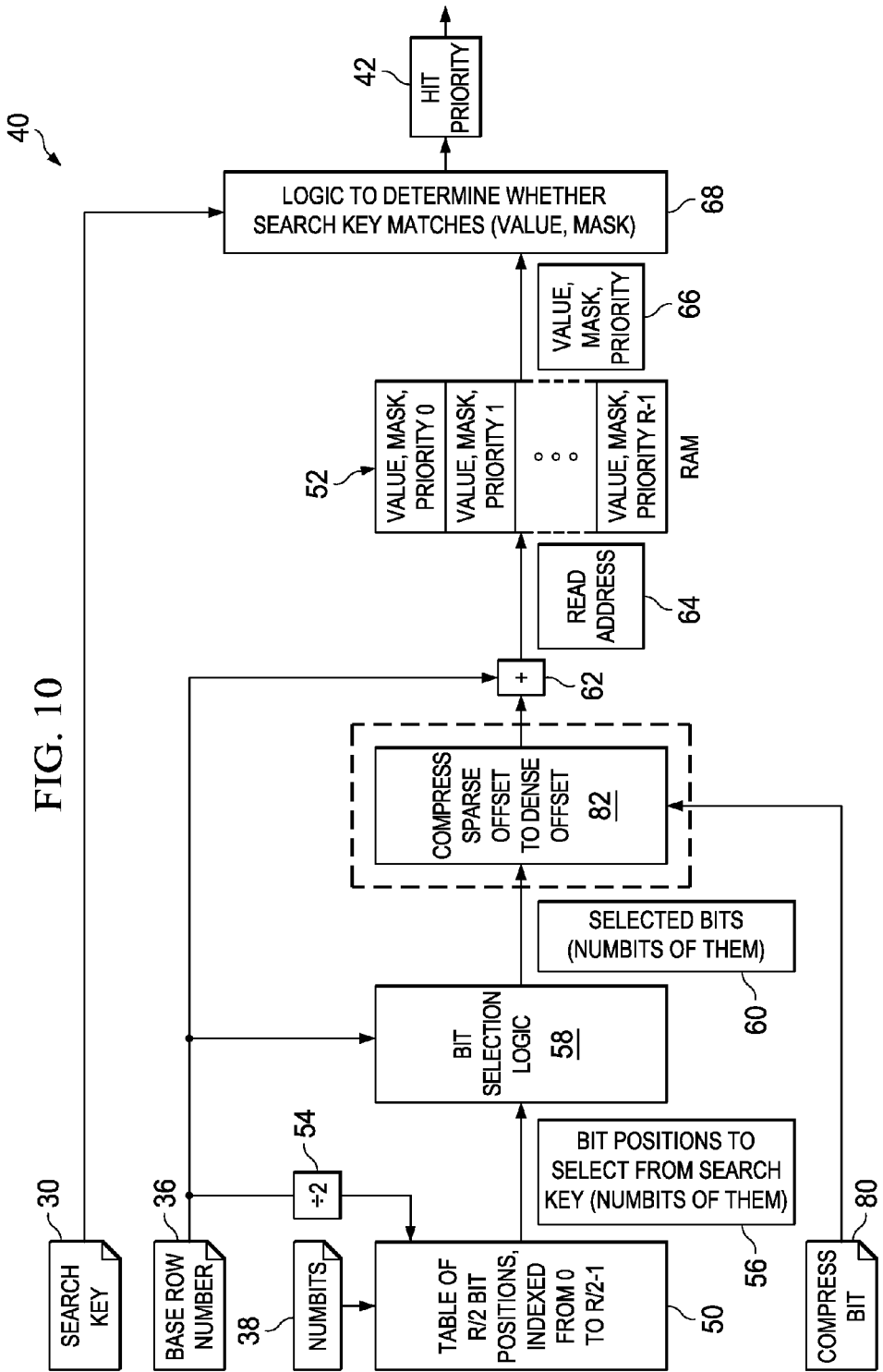
FIG. 10 is a simplified block diagram illustrating yet other example details of an embodiment of the communication system.

Turning to FIG. 10, FIG. 10 is a simplified block diagram illustrating an example embodiment of communication system 10. Compress bit 80 indicates a bit corresponding to substantially every entry of table 50. Compress bit 80 may have a value of 1 for any label (e.g., corresponding to a specific VM list) that uses it, and a value of 0 for labels that do not use it.

Compress bit 80 may be broadcast to substantially all segments 40(1)-40(S). Inside each segment 40, compress bit 80 may be used to indicate compression of selected bits. For example, for a value of compress bit 80 of 1, compression may be implemented, whereas for a value of compress bit 80 of 0, compression may not be implemented. The decision to compress and the compression may be performed in block 84 labeled "compress sparse offset to dense offset."

In some embodiments, compression may be reserved for the largest VM supported by router 14. For example, the VM list requiring over half the rows in LPTCAM 18 may be compressed, to the exclusion of other, smaller, VM lists. Adding a new VM list can be done in a hitless manner if any compression of existing VM lists can be done without misclassifying a packet.

If such a change introduces the possibility of misclassifying a packet, even for a short time, the configuration change may be hitful. Predictability may be preserved in embodiments that implement compression. The hardware size of large VM lists need not be a power of 2 values if a deterministic function can be used to calculate the hardware sizes of VM lists.

Order-independence may be achieved with buddy memory allocation for substantially all VM lists except the huge VM list that occupies more than half the rows 52 of LPTCAM 18. According to various embodiments, the huge VM list may be added "at the beginning", i.e. with base row address 0, or "at the end", i.e. at a base row address such that its last row 52 corresponds to the last row of LPTCAM 18. The addition may be hitless, for example, by first compressing all pre-existing VM lists to the opposite end of LPTCAM 18.

Placing the huge VM list at one end allows other rows 52 (e.g., for non-huge VM lists) to be contiguous, and buddy memory allocation may used for such VM lists. If a huge VM list is currently in use in LPTCAM 18, and the policy-based rule that caused that huge VM list to be added is to be switched with another rule list that produces another huge VM list, the change may be made in a hitful manner. The currently used old VM list may have to be removed before the new VM list can be added.

Turning to FIG. 11, FIG. 11 is a simplified pseudo code according to an example embodiment of communication system 10. In some embodiments, decision trees may be used for selecting bits from search key 32. For substantially all the VMs to be placed in a single segment 40, a set of bit positions common to every VM in segment 40 may be found such that they have no wildcards in the bit positions, and the selected bit positions are different in every VM.

Instead of simultaneously extracting a specific number (e.g., 3) of configured bits from search key 32, a single bit from a single configured bit position may be selected, e.g. bit position 2. If the value of bit 2 is equal to 0, a next bit position may be extracted. If the value of bit 2 is equal to 1, bit position 6 may be extracted.

Similarly, based upon the value of the second bit that was extracted, one of two different bit positions may be chosen to extract a third bit. Such a procedure can be represented as a binary decision tree. Pseudo code 84 is an example procedure implemented in each segment 40 when search key 32 is received and numbits bit positions are to be selected from search key 32 to form a RAM read address.

Pseudo code 84 includes a function decision_tree_search( ), that takes as input search key 32 (e.g., variable K), numbits 38, and root node (e.g., T) of a decision tree. The output O may be a list of bits A formed by selecting bits from search key 32. A may be initialized to an empty list. A counter N may be initialized to T, the root node of the decision tree.

While N is not 0, a variable p may store a bit position of tree node N, and variable b may be set to an extracted bit position p from search key 32. Bit value of b may be appended to end of A. If b is zero, counter N may be set to a left child of N, if any, and otherwise set to 0. If b is not zero, counter N may be set to a right child of N, if any, and otherwise set to 0. The decision tree may be processed from root node through child nodes until A is determined.

Turning to FIG. 12, FIG. 12 is a simplified illustration of an example decision tree that may be associated with an embodiment of communication system 10. An example decision tree 90 is illustrated. Node 92 indicates a root node N of decision tree 90. Root node 92 may be arbitrarily selected in some embodiments. Root node 92 has a bit position 2 in example decision tree 90.

If value of root node 92 is 0, decision tree 90 may step to node 94, which indicates a second bit position to extract for search key 32. Root node 94 has a bit position 0 in example decision tree 90. On the other hand, if value of root node 92 is 1, decision tree may step to node 96, which indicates a second bit position to extract for search key 32. Root node 96 has a bit position 6 in example decision tree 90.

From 94, decision tree may step to nodes 98 or 100, depending on whether the second bit position at node 94 was 0 or 1, respectively. Root node 98 has a bit position 1 in example decision tree 90. Root node 100 has a bit position 4 in example decision tree 90.

Likewise, from 96, decision tree may step to nodes 102 and 104, depending on whether the second bit position at node 96 was 0 or 1, respectively. Root node 102 has a bit position 3 in example decision tree 90. Root node 104 has a bit position 5 in example decision tree 90.

Assume that decision tree 90 is used for search key 32=0111001. Value of bit position 2 in search key 32 is 0, resulting in list A of [0]. According to decision tree 90, the next decision step is node 94, at bit position 0. Value of bit position 0 is 1. Thus, A becomes [0,1].

According to decision tree 90, the next decision step is node 100, at bit position 4. Value of bit position 4 is 1. Thus, A becomes [0,1,1]. Thus example decision tree 90 returns list [0,1,1], which concatenated together forms the read address 011 in binary, or 3 in decimal.

Turning to FIG. 13, FIG. 13 is an example table according to an embodiment of communication system 10. Table 110 shows an example list of bit positions extracted, in order, for a search key 32 matching a specific VM, and the resulting binary read address, obtained using example decision tree 90. Note that the 3 bit binary read addresses are different from each other. Thus all the VMs can be stored in the same segment 40, if the segment uses the binary decision tree for constructing RAM addresses.

Decision trees enable a flexible selection process, but can involve costs, such as additional configuration in each segment, and more time per search key to extract the bits for the read address (e.g., each bit may be extracted and examined before extracting the next bit position). Alternately, substantially every possible bit position of interest that appears anywhere in the binary decision tree may be extracted, but such implementation may use more hardware area.

Figure 14:
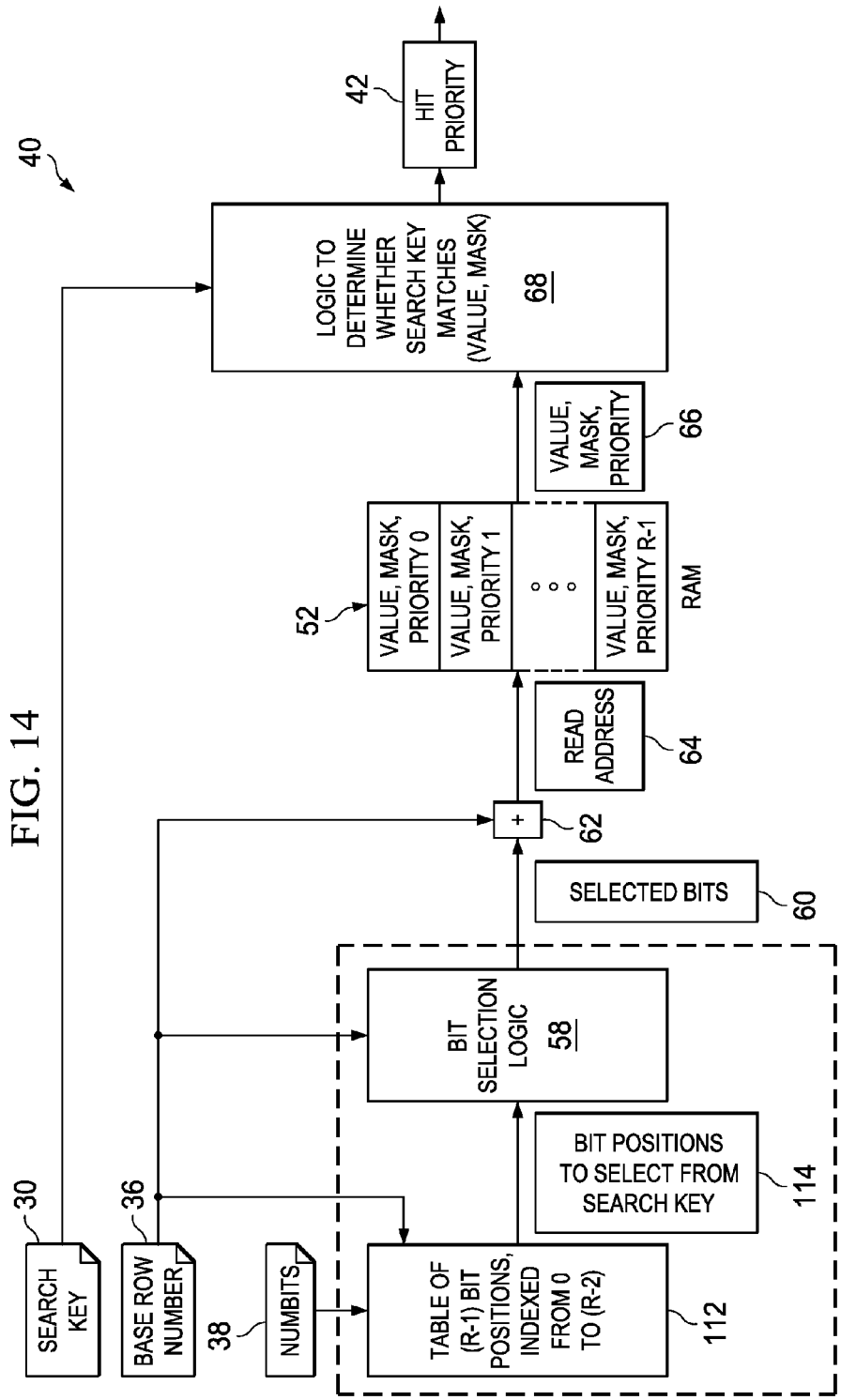
FIG. 14 is a simplified block diagram illustrating yet other example details of an embodiment of the communication system.

Turning to FIG. 14, FIG. 14 is a simplified block diagram illustrating an example embodiment of communication system 10. In various embodiments, R−1 bit positions may be used to configure segment 40 with R rows. A decision tree with R possible address values can have R nodes.

Such a full binary decision tree has a depth equal to the base 2 logarithm of R, denoted $\log_2 R$, where depth is the maximum number of nodes examined on a path from the root node to any leaf node. For example, example decision tree 90 with 7 nodes is large enough to support a segment with 8 rows, but no more. It has a depth of $\log_2 8 = 3$.

In some embodiments, LPTCAM 18 may use R−1 bit positions to configure segment 40, where R is the total number of rows 52 in each segment 40. The R−1 values may be in a one depth $\log_2 R$ decision tree for a VM list that uses all R rows. Some other possibilities include 2 VM lists, each using R/2 rows, 4 VM lists, each using R/4 rows, R/2 VM lists, each using 2 rows, and R (or more) VM lists, each fitting within 1 row.

For 2 VM lists, each using R/2 rows, each binary decision tree has depth $\log_2 R - 1$ and has $2^{\log_2 R-1} - 1 = R/2 - 1$ nodes. The total number of nodes in the two trees is thus R−2. For 4 VM lists, each using R/4 rows, each binary decision tree has depth $\log_2 R - 2$ and has $2^{\log_2 R-2} - 1 = R/4 - 1$ nodes. The total number of nodes in all four trees is R−4.

For R/2 VM lists, each using 2 rows, each binary decision tree has depth 1 and has $2^1 - 1 = 1$ node. The total number of nodes in all R/2 trees is R/2. For R (or more) VM lists, each fitting within 1 row, no binary decision trees are needed at all.

There are many other possibilities within the broad scope of the embodiments. The binary decision tree may be stored as a linear list of node contents, by "reading the tree" from left to right in each row, from the top row to the bottom row, just like English text on a page. For example, example binary decision tree 90 has a linear list of bit position values 2, 0, 6, 1, 4, 3, 5.

According to various embodiments, segment 40 may include a table 112 that maintains a list of R−1 bit positions indexed from 0 to R−2. In various embodiments, control module 30 may implement buddy memory allocation in table 122. The bit positions may indicate the nodes of the decision tree to be used in selecting the bits.

Segment 40 may use base row number 36 as the index of the first entry in a (R−1)-entry list (with the first entry indexed at 0), and $2^{numbits} - 1$ consecutive values starting therefrom may be selected as bit positions 114. Bit selection logic 58 may use bit positions 114 on a decision tree with depth equal to the value of numbits 38 and $2^{numbits}-1$ nodes, to select bits according to decision_tree_search( ) function 84.

Figure 15:
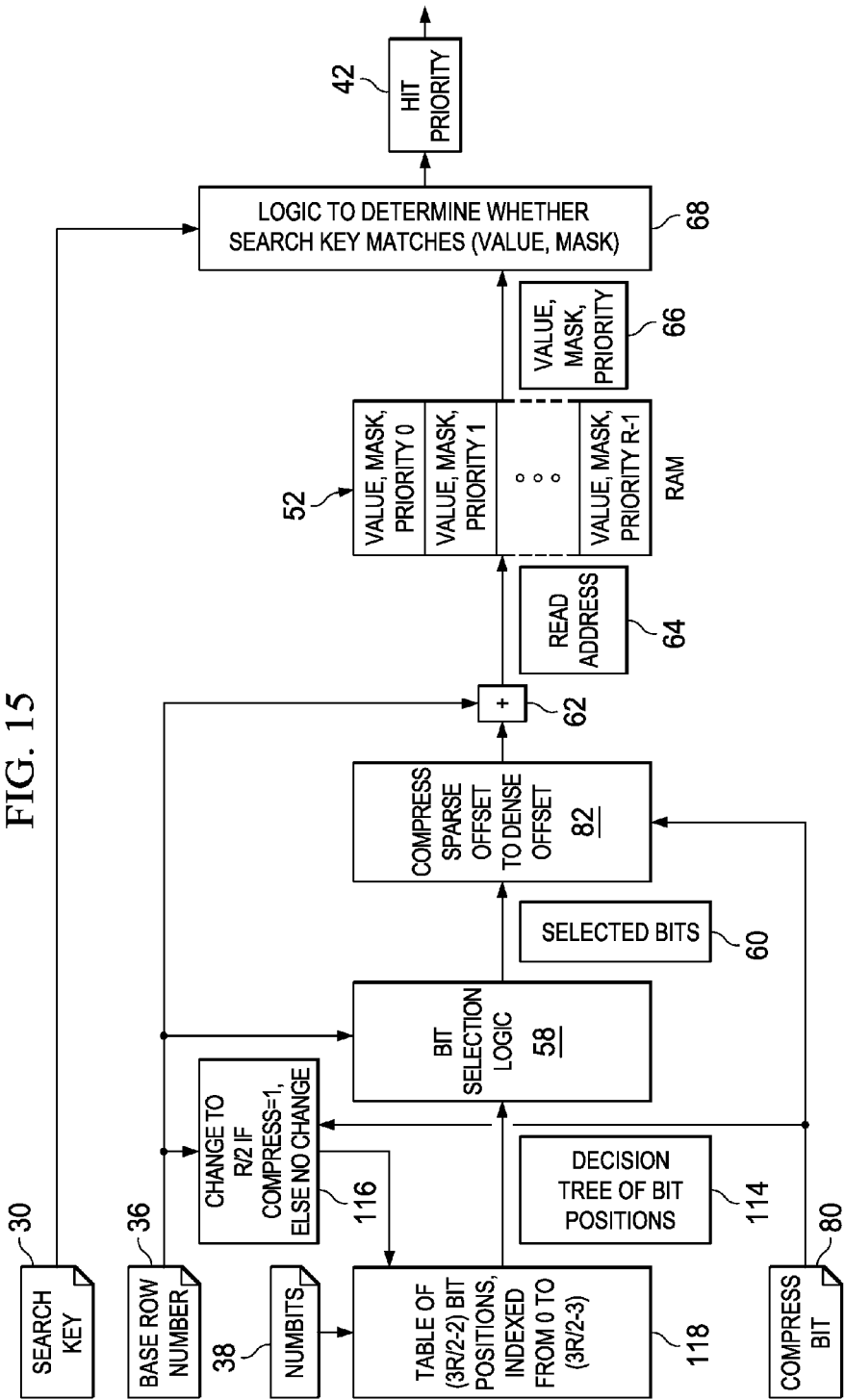
FIG. 15 is a simplified block diagram illustrating yet other example details of an embodiment of the communication system.

Turning to FIG. 15, FIG. 15 is a simplified block diagram illustrating an example embodiment of communication system 10 that implements a decision tree logic and compression. According to the example embodiment, if there is simultaneously one huge VM list (e.g., VM list that can occupy more than half the number of rows 52 in segment 40), and one or more non-huge VM lists that fill approximately (but less than) half of rows 52 in LPTCAM 18, then R−1 nodes in substantially all binary decision trees may not be sufficient to program all VMs into LPTCAM 18, where R is the total number of rows 52 in segment 40.

For example, R−1 nodes can be sufficient for the binary decision tree of the one huge VM list. The other VM lists that can be entered into LPTCAM 18 simultaneously as the huge one can be nearly sufficient to use a total of R/2 rows, which can require R/2−1 nodes in the corresponding decision tree. Thus a decision tree that includes the total, or 3R/2−2 nodes, can be sufficient to describe substantially all the binary decision trees that can be needed simultaneously. For example, for R=256, the decision trees can have 382 nodes in total.

According to various embodiments, the configuration of LPTCAM 18 can be restricted to provisioning the huge VM list (if any) at the end of rows 52 (e.g., the last row of the huge VM list is row numbered R−1). The non-huge VM lists that are installed simultaneously can be provisioned at the beginning of rows 52 (e.g., in rows 0 through R/2−1), and base row number 36 may be used as before (e.g., to locate the read address in RAM).

The huge VM list may have any base row number 36. In a specific embodiment, the nodes in the decision tree can be selected from index R through 3R/2−3, where R is the number of rows 52 in segment 40. For example, for a segment with 256 rows, indices 382−255+1=128 through 381 can be selected for the decision tree.

The overall structure of LPTCAM 18 that allows decision tree selection and compression can include a block 116 that can change index positions in table 118, which may be indexed from 0 to (3R/2−3), for a total of 3R/2−2 bit positions. In various embodiments, control module 30 may implement buddy memory allocation in table 118.

When compress bit 80 is 1 (indicating compression and possible presence of a huge VM list), index value for the huge VM list may be forced to start from R/2 in table 118 (e.g., by changing base row number 36 to R/2). On the other hand, if compress bit is 0 (indicating no compression, and possibly no huge VM list), the index value for the VMs may be any value between 0 and (3R/2−2). In addition, base row number 36, numbits 38, and compress bit 80 may be broadcast to all segments 40(1)-40(S) in LPTCAM 18.

Turning to FIG. 16, FIG. 16 is a simplified flow diagram illustrating example operations that may be associated with an embodiment of communication system 10. Operations 120 may include 122, at which the VM list may be encoded into rows 52 in segments 40(1)-40(S) in LPTCAM 18. At 124, label 33 of the VM list may be mapped to base row number 36 and numbits 38 in table 34 of LPTCAM 18.

At 126, representative packet processing ASIC 20 may generate search key 32 and sent to LPTCAM 18. LPTCAM 18 may receive search key 32. At 128, specific rows to compare with search key 32 may be determined. In an example embodiment, the specific rows may be determined by looking up table 34 and by extracting base row number 36 and numbits 38 corresponding to label 33 of the VM list under analysis. At 130, search key 32 may be compared with the value mask pairs of the applicable rows. At 132, a comparison result 46 may be output.

Turning to FIG. 17, FIG. 17 is a simplified flow diagram illustrating example operations that may be associated with embodiments of communication system 10. Operations 140 may include 142, at which a VM list is received at router 14. At 144, a determination may be made whether the VM list can fit into one row in LPTCAM 18.

If the VM list can fit into one row, the value of numbits 38 may be set to 0 at 146, and read address 64 may be set to base row number 36. If the VM list cannot fit into one row, at 148, numbits number of bits may be selected from search key 32. At 150, the selected bits may be concatenated into a binary value with numbits bits. At 153, the read address 64 may be set to the sum of base row number 36 and the binary value computed at 150.

Figure 18:
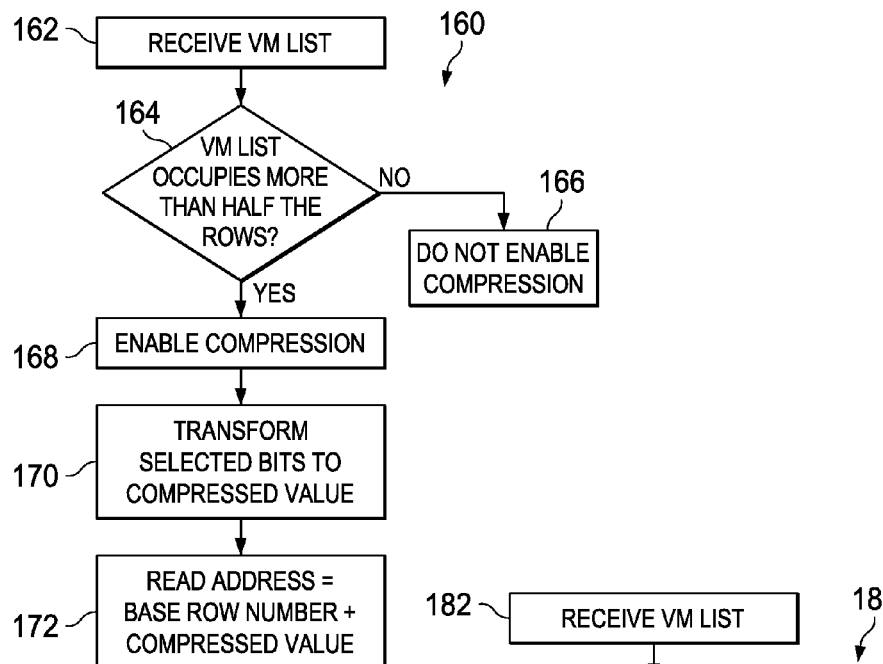
FIG. 18 is a simplified flow diagram illustrating yet other example operations that may be associated with embodiments of the communication system.

Turning to FIG. 18, FIG. 18 is a simplified flow diagram illustrating example operations that may be associated with embodiments of communication system 10. Operations 160 may include 162, at which the VM list may be received at router 14. At 164, a determination may be made whether the VM list occupies more than half the rows in LPTCAM 18.

If the VM list does not occupy more than half the rows in LPTCAM 18, compression may not be enabled at 166. If the VM list occupies more than half the rows in LPTCAM 18, compression may be enabled at 168. At 170, selected bits may be transformed to a compressed value. At 172, read address 64 may be determined as the sum of base row number 36 and the compressed value computed at 170.

Figure 19:
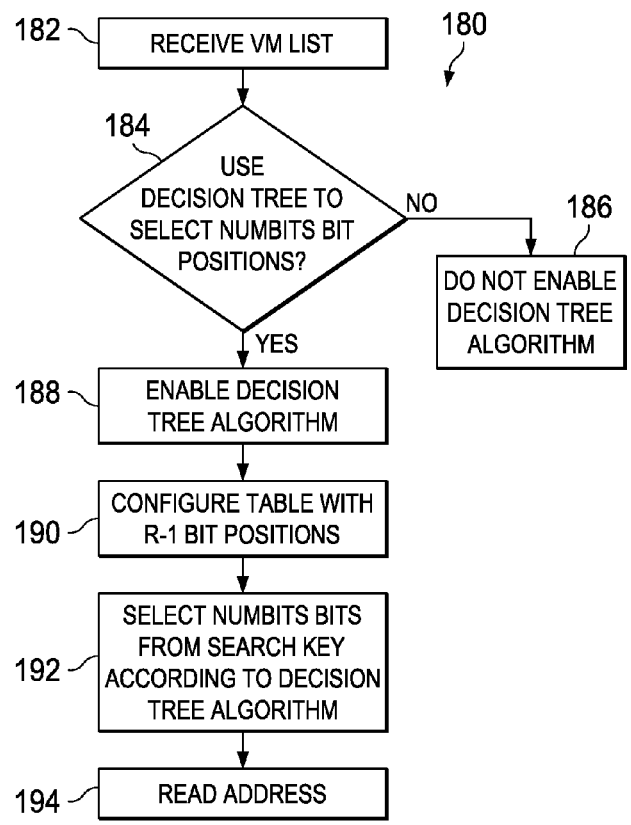
FIG. 19 is a simplified flow diagram illustrating yet other example operations that may be associated with embodiments of the communication system.

Turning to FIG. 19, FIG. 19 is a simplified flow diagram illustrating example operations that may be associated with embodiments of communication system 10. Operations 180 may include 182, at which the VM list may be received at router 14. At 184, a determination may be made whether to use a decision tree to select numbits bit positions.

If the decision tree is not to be used, the decision tree algorithm may not be enabled at 186. Otherwise, if the decision tree is to be used, the decision tree algorithm may be enabled at 188. At 190, table 112 may be configured with R−1 bit positions. At 192, numbit bits may be selected from search key 32 according to the decision tree algorithm. At 194, read address 64 may be determined.

Figure 20:
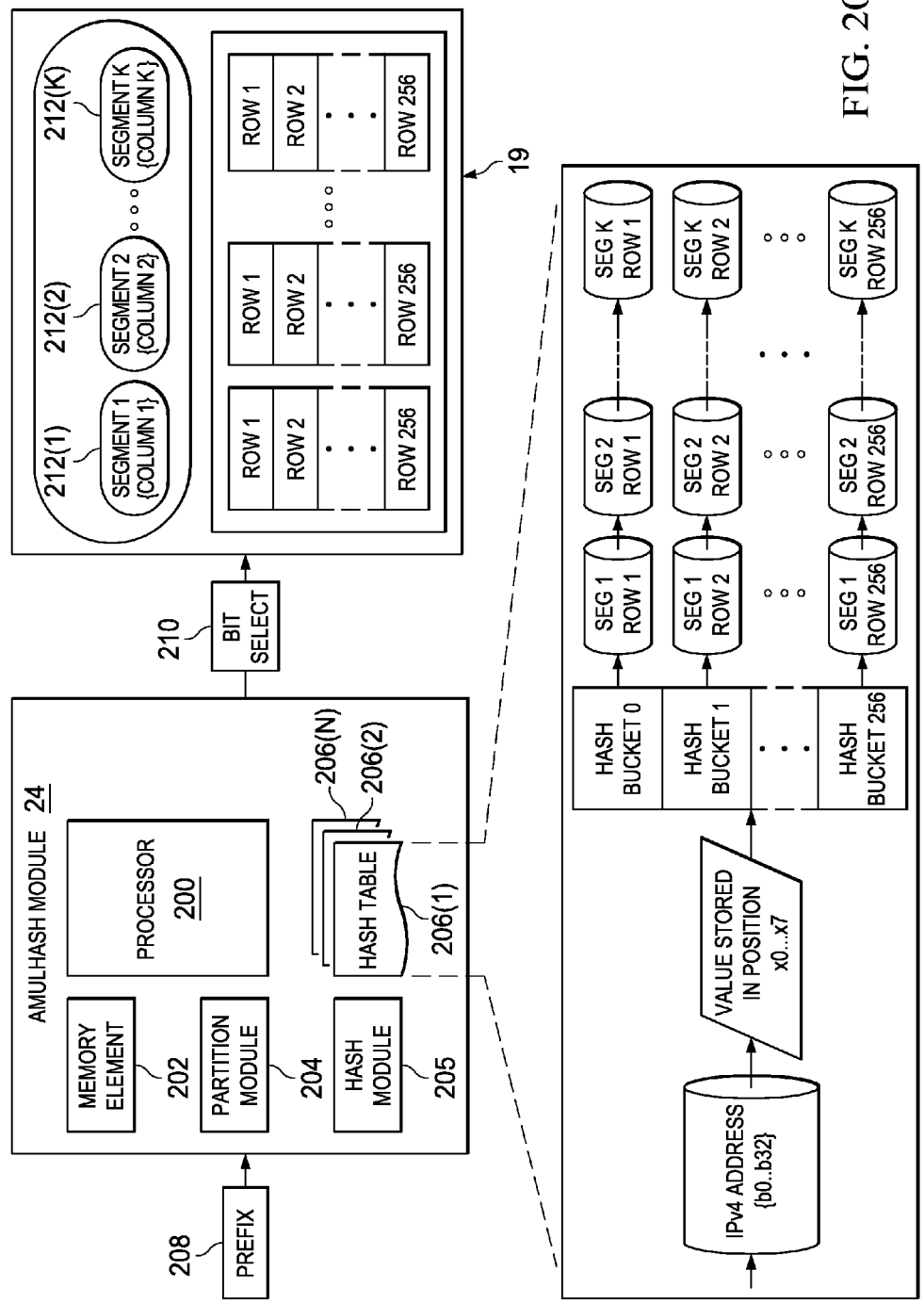
FIG. 20 is a simplified block diagram illustrating yet other example details of an embodiment of the communication system.

Turning to FIG. 20, FIG. 20 is a simplified block diagram illustrating example details of an embodiment of communication system 10. Representative AMULHASH module 24 (implemented in a representative router 14) can include a processor 200, a memory element 202, a partition module 204, a hash module 205, and one or more hash tables 206(1)-206(N). N may be any value, according to the broad scope of the embodiments. For example, in some particular embodiments, N may be 25.

AMULHASH module 24 may be used to configure prefix lists in representative router 14. A specific prefix 208 in a prefix list may be fed to AMULHASH module 24. The output from AMULHASH module 24 may be a bit select 210 that can indicate a row in segments 212(1)-212(K) in representative SLTCAM 19, into which prefix 208 may be encoded. Each segment 212 (e.g., segment 212(1)) may include n (e.g., 256) rows, with each row configured to store a specific prefix (or a VM corresponding to the prefix) from the prefix list. In a general sense, segments 212(1)-212(K) with 256 rows may have at least 8 bits (value bit select) unique among them. The value bit select may represent an individual entry within a segment, and not the segment itself.

SLTCAM 19 can be operated in two phases—the control phase, during which SLTCAM 19 is loaded with the prefix lists, and a data phase, during which SLTCAM 19 compares a given prefix (e.g., in a search key) against the stored prefixes and returns a result. In various embodiments, AMULHASH module 24 may be operational during the control phase, to facilitate loading SLTCAM 19 with the prefix lists.

Processor 200 may be charged with loading appropriate configuration registers and memory elements in SLTCAM 19 with prefixes. Once loaded, SLTCAM 19 can operate independently of AMULHASH module 24, comparing search keys with stored prefixes.

In SLTCAM 19, prefixes are stored in K segments 212(1)-212(K), each with no more than n rows, such that within each segment, no more than one row can match any given input. Certain (e.g., $\log_2 n$) bit positions (e.g., bit select 210) of a prefix (e.g., prefix 208) are selected for each segment 212(1)-212(K) according to embodiments of communication system 10, so that the values of the selected bit positions in prefix 208 are sufficient to distinguish a singe row from the remaining rows in the segment. Each row may be identified by a read address corresponding to the concatenated bit positions selected based on bit select 210. For example, in a segment containing 256 rows, 8 bits may be sufficient to distinguish one row from another with unique 8-bit read addresses, and consequently bit select 210 may include 8 bits.

Although the embodiment illustrated in FIG. 20 is shown applied to SLTCAM 19, embodiments of communication system 10 can be applied to various platforms, including platforms that support an overflow TCAM, platforms that support SLTCAM 19, platforms that support more granular segments (e.g., anything <=256), platforms that support ACLs to be leveraged to simulate overflow TCAM, platforms where large number of segments are available (e.g., XL cards) and platforms where high scale is desired.

As used herein, the term "hash table" can include a data structure that uses a hash function to map identifying values, known as keys (e.g., prefix 208), to their associated values (e.g., segment 212(1)-212(K)). Thus, the hash table implements an associative array. In some embodiments, the hash table can be a pointer table, populated with pointers to corresponding rows in segments 212(1)-212(K). The hash function may be used to transform the key into an index of an array element (the slot or bucket) where the corresponding value is to be sought. In various embodiments, the index corresponds to bit select 210, and the buckets correspond to rows in segments 212(1)-212(K). Thus, segments 212(1)-212(K) can be logically viewed as portions of hash tables 206(1)-206(N). In various embodiments, bit select 210 may be derived from prefix 208.

According to various embodiments, partition module 204 may partition (e.g., chop, divide) prefix 208 into multiple blocks, with each block comprising a particular selection of bits in prefix 208. In various embodiments, the blocks may be 8 bits in size, corresponding to the number of bits in bit select 210. The blocks may be chosen such that random and non-random (e.g., consecutive) prefixes may be appropriately categorized into various hash tables 206(1)-206(N).

The value of each block can be considered as an index to a separate hash table. In other words, each hash table 206(1)-206(N) may be associated with a specific index (e.g., value of a specific block), corresponding to a particular selection of bits (e.g., bit select 210) of prefix 208. Hash module 205 may hash (e.g., associate, map, correlate, correspond) prefix 208 into a specific hash table (e.g., 206(1)) according to the index (e.g., bit select 210) derived from prefix 208. Prefix 208 may be stored in a row in one of segments 212(1)-212(K) corresponding to a bucket of hash table 206(1), where the value indicates a read address of the row. In various embodiments, the segment may be moved to another hash table to accommodate another prefix.

An example hash table 206(1) is shown in the FIGURE. Hash table 206(1) may include multiple rows, corresponding to the rows in segments 212(1)-212(K). An IPv4 address, with bits 0-32 may be categorized into hash buckets based on the value stored in bit positions 0 to 7. Logically, all segments 212(1)-212(K) in SLTCAM 19 that use the same partitioned value can be considered as a bucket in hash table 206. In a general sense, segments represent a column of hash entries, and entries from multiple segments can be viewed as a hash bucket. Each of segments 212(1)-212(K) may add a bucket of items (e.g., prefixes) to hash table 206(1). Hash table 206(1) may also include a list of free (e.g., unpopulated) items in each bucket, which can be used to determine quickly if (and where) prefix 208 can be inserted into hash table 206.

For example, consider a prefix list with prefixes 10.10.10.2/32, 10.10.10.3/32, and so on until 10.10.10.15/32 that is to be loaded in one or more of segments 212(1)-212(K). Assume, merely for ease of illustration, and not as a limitation, that no segments are assigned to hash tables 206(1)-(N). Partition module 204 may partition 10.10.10.2 into 4 separate blocks, with each block associated with a separate hash table level. The first three blocks have a value 10, and may be indexed to separate hash tables 206(1)-(3) in three different levels (e.g., Level 0, 1, 2). The fourth block may include values ranging from 2 to 15. Hash module 205 may hash the prefixes into hash table 206(4) in the first available bucket (segment) that can accommodate the prefixes. For example, the prefixes may be loaded into segment 212(1) in hash table 206(4). Thus, the last 8 bits are used to index to hash table 206(4) in the fourth level, and associated with segment 212(1).

In another example, if prefix 208 is 3.10.10.2/8, and no segments are associated with any hash table in the first level, hash module 205 may hash prefix 208 into hash table 206(1) in another bucket (e.g., segment 212(2)). Prefix 208 may be accessed in segment 212(2) by the index value of the first block (i.e., first 0-7 bits).

In various embodiments, prefixes stored in hash tables 206(1)-206(N) can be moved dynamically among hash tables 206(1)-206(N) depending on the values of the blocks, and the operations can adapt to a given prefix list. For example, segments may be moved from a hash table at one level to another hash table in another level. In another example, segments may be moved from a hash table to another hash table at the same level.

In various embodiments, the blocks may not be contiguous. Rather, they can be non-contiguous and can be formed by borrowing bits from different prefix bytes. For example, if prefix 208 is not fully aligned to 8-bits, an 8-bit value may be formed by borrowing bits from a penultimate prefix byte.

In many scenarios, the prefixes may be consecutive, with a last byte incrementing sequentially. For such subset of prefixes, borrowing bits from a penultimate prefix byte can avoid horizontal expansion. "Horizontal expansion" refers to causing hash tables 206(1)-206(N) to deepen by increasing the number of buckets therein.

In an example, a prefix list may contain 30 consecutive IPv4 prefixes starting with {1.0.0.0/9} to be loaded into segments 212(1)-212(K). One possibility for indexing the prefix is to index according to the first 8 bits (i.e., bits 0-7). When bits 0 to 7 are selected, the prefixes may have to be loaded into 30 separate segments sharing the value 1 in a hash table in the first level (e.g., hash table 206(1)), thus causing horizontal expansion of hash table 206(1).

On the other hand, if bits 1-8 are selected as the index (thus borrowing a bit from the penultimate byte), the values of bits 1-8 may be {0, 1, 2 . . . 30}, which can fit into 30 rows in a single bucket (corresponding to a single segment) of a hash table in the second level (e.g., hash table 206(2)). In some embodiments, if prefix 208 cannot be inserted into any hash tables 206(1)-206(N), the items may be moved among hash tables 206(1)-206(N) to create space to accommodate prefix 208.

In various embodiments, the hashing (e.g., mapping prefixes to indexes) may vary with the prefix length. For example, each hash table level may be based on the prefix length, with a higher level indicating a longer prefix length. As used herein, the term "prefix length" can indicate a number of shared initial bits, counting from the most significant bit of the IP address. In other words, prefix length can indicate a number of bits set in a subnet mask to 1, in the binary form.

Prefix length is an indicator of the size of the network. For example, a subnet mask 255.0.0.0, represented as 11111111 00000000 00000000 00000000 has a prefix length of 8. Another subnet mask 255.255.255.255, represented as 11111111 11111111 11111111 11111111, has a prefix length of 32.

In some embodiments, AMULHASH module 24 can load segments 212(1)-212(K) with prefix 208, followed by a plurality of other prefixes formed by incrementing a last byte of prefix 208. The entire prefix list can be viewed as a set of consecutive prefixes. In various embodiments, the consecutive prefixes indicate prefixes of the same length where any single part of the prefix can be consecutive. For example, consecutive prefixes may include 1.1.1.0/24, 1.2.1.0/24, 1.3.1.0/24.

In some embodiments, the number of items in each such implementation could be anywhere from 1 to 256. The hashing operations may work for prefix lists less than 256 by making the partitions more granular. For example, 5-bits of the last prefix byte of prefix 208 may be used as an index, with other 3 bits of the 8 bits selected from other prefix bytes.

Although the operations in connection with AMULHASH module 24 have been described herein with respect to segments that have 256 rows, the operations may be extended to hardware of any size, with appropriate modifications. For example, the operations may be applied to hardware that has one bit-select 210 for every 512 72-bit entries by allocating a pair of segments (rather than a single segment) at a time to hash tables 206(1).

Moreover, although the operations are described with respect to IPv4 unicast, the concepts can be extended to IPv4 multicast as well. For example, (*, G) (e.g., multicast group from any source) is not treated differently from unicast, and for (S, G) (e.g., multicast group with a specific source and group), four additional hash levels may to be defined in hash table 206. Thus, (S, G) can involve an eight-way hash lookup.

Similarly, IPv6 unicast and multicast lookups can also be realized using the operations described herein with appropriate modifications. The number N of hash tables 206(1)-206(N) for IPv6 can be large (e.g., with 16 levels, each having its own set of hash tables), most of the prefix bytes may be zero, leading to non-utilization of many of the hash tables.

To support VPNs, typically, 14 bits of VPN identification may be added to prefix 208. Although, the VPN ID can cause the number of hash levels to increase by 2, the addition may be accommodated according to various embodiments, with one level, rather than two, for example, by representing the lower 8 bits of the VPN ID, rather than all 14 bits.

In general, the VPN IDs are sequential, and the upper byte may rarely change. For example, for a configuration that includes 1000 VPN routing and Forwarding (VRFs), the upper VPN ID byte may change only 4 times.

For platforms that cannot implement hashing in hardware, AMULHASH module 24 can provide an alternate solution for IP lookups. For example, AMULHASH module 24 can be effective for platforms where the number of segments available in hardware is high (e.g., around 4K). According to various embodiments, hash tables 206(1)-206(N) can be created for each prefix length that is configured in router 14.

In high scale systems (e.g., with 1 million or more prefixes stored in segments 212(1)-212(K)), the cost associated with hash tables 206(1)-206(N) may be negligible, unlike in low scale systems, where the total number of available segments (e.g., segments 212(1)-212(K)) is low (e.g., K is approximately 96). In high scale systems, AMULHASH module 24 can have high utilization (>90%) and convergence.

In some embodiments, performance (e.g., utilization) of AMULHASH module 24 can be improved with the use of an overflow TCAM (e.g., by off-loading a portion of the indexed entries to the overflow TCAM). In terms of memory requirements, AMULHASH module 24 can requires 1K for each of hash tables 206(1)-206(N), and about 4K for each segment 212(1)-212(K). For example, a running model, which uses stored characters as bitmaps for easy implementation takes about 350 MB for 1 Million prefixes.

In various embodiments, partition module 204 and hash module 205 may be software applications implemented on a control processor of line cards in a router. In other embodiments, partition module 204 and hash module 205 may be implemented in hardware, for example, in an application specific integrated circuit (ASIC), or similar component within router 12. In various embodiments, partition module 204 and hash module 205 may cause memory element 202 to store appropriate instructions directed to the operations described herein and may cause processor 200 to execute the instructions as needed.

Figure 21:
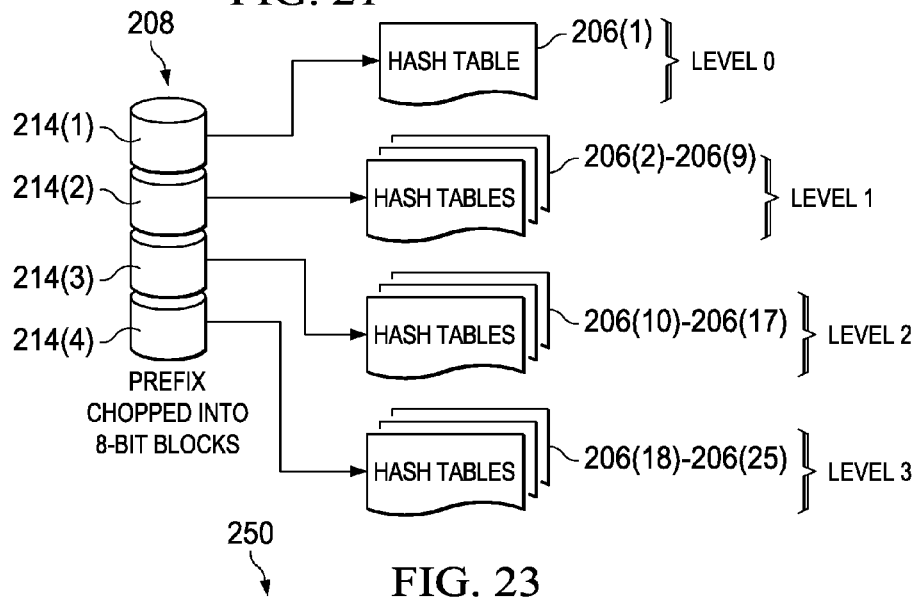
FIG. 21 is a simplified block diagram illustrating yet other example details that may be associated with an embodiment of the communication system.

Turning to FIG. 21, FIG. 21 is a simplified block diagram illustrating example details of an embodiment of communication system 10. Prefix 208 may be partitioned into 8-bit blocks 214(1)-214(4) comprising 4 levels indicated as Level 0, Level 1, Level 2, and Level 3. Each level may include a plurality of hash tables.

For example, level 0 includes hash tables 206(1); level 1 includes hash tables 206(2)-206(9); level 2 includes hash tables 206(10)-206(17); and level 3 includes hash tables 206(18)-206(25). The example number of hash tables illustrated in FIG. 21 is merely for ease of illustration and is not a limitation. Any number of hash tables may be incorporated at each level, with any number of levels, according to prefix lengths, and other particular configuration needs.

Block 214(1) may be indexed into hash table 206(1) in Level 0; block 214(2) may be indexed into one of hash tables 206(2)-206(9) in Level 1; block 214(3) may be indexed into one of hash tables 206(10)-206(17); and block 214(4) may be indexed into one of hash tables 206(18)-206(25). In various embodiments, choice of a specific hash table at any level may be driven by the prefix length.

Turning to FIG. 22, FIG. 22 is a logical view of example hash tables according to an embodiment of communication system 10. In various embodiments, hash tables 206(1)-206(N) may be stored in any suitable format, data structure, table, database or other appropriate storage mechanism based on particular hardware limitations. According to various embodiments, the choice of a specific hash table may be driven by the prefix length.

For example, hash table HT_0 can be used for any prefix with prefix length >=8, hash table HT_8 can be used for any prefix with prefix length >=16, and so on. Thus, a /32 prefix can be indexed into any one of hash tables HT_8, HT_16, HT_24 or HT_32. Unaligned prefixes may have their own hash tables. In addition, they may be organized into HT_0, 8 or 16 as appropriate. The prefix lengths may determine the number of hash tables that are available for a given prefix.

Figure 23:
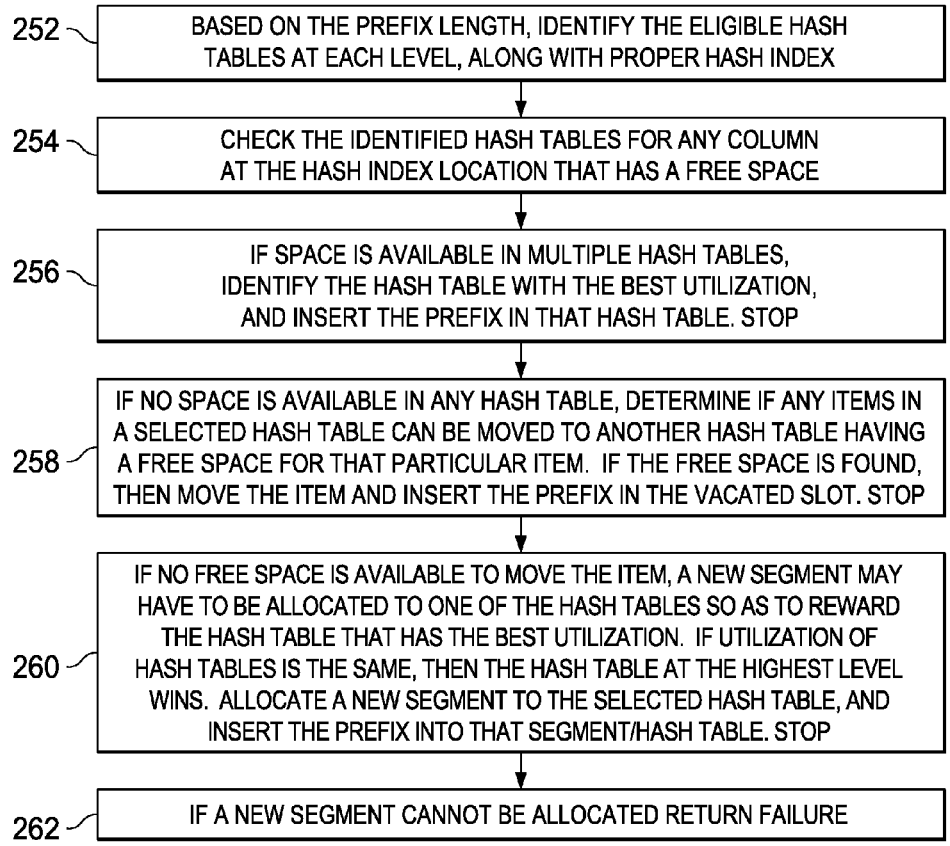
FIG. 23 is a simplified flow diagram illustrating example operations that may be associated with an embodiment of the communication system.

Turning to FIG. 23, FIG. 23 is a simplified flow chart illustrating example operations that may be associated with an embodiment of communication system 10. Operations 250 may be associated with inserting prefix 208 into one of segments 212(1)-212(K). At 252, eligible hash tables 206(1)-206(m) (m<=N) may be identified at each level (e.g., Level 0, 1, 2, 3) along with the appropriate hash index at each level for prefix 208.

An initial determination may be made whether prefix 208 is aligned to 8 bits. If prefix 208 is aligned to 8 bits, prefix 208 may be partitioned into 8 bit blocks. If prefix 208 is not aligned to 8 bits, bits from a penultimate prefix byte may be borrowed before partitioning. The blocks may indicate the specific levels and the hash index.

At 254, identified hash tables 206(1)-206(m) may be checked for any bucket at the hash index location that has a free space. For example, a row corresponding to the hash index may be checked to see if any free slots are available. At 256, if space is available in multiple hash tables 206(1)-206(g) (g<=m), the hash table 206(i) with the best utilization may be identified, for example, to compact the items as much as possible and to avoid spraying the items evenly. To start with, utilization may be set to a MAX_VALUE for all hash tables 206(1)-206(N), and updated for each item insertion or deletion.

At 258, if no space is available in any hash table, a determination may be made whether any items in a selected one of hash tables 206(1)-206(m) can be moved to another hash table having a free space for that particular item. For example, the operations may be similar to cuckoo hashing, which is a scheme for resolving hash collisions. Unlike cuckoo hashing, however, the item may be moved only if a free space is available. If the free space is found, the particular item may be moved thereto, and prefix 208 may be inserted into the vacated slot. Thereupon, the operations may end.

If no free space is available to move the item, at 260, a segment 212(k) may have to be allocated to hash table 206(i) with the best utilization. To identify hash table 206(i), utilization of hash tables 206(1)-206(m) is measured. If utilization of hash tables 206(1)-206(m) is the same, hash table 206(m) at the highest level (e.g., Level 3) wins. New segment 212(k) may be allocated to selected hash table 206(m), and prefix 208 may be inserted into new segment 212(k). Thereupon, the operations may end. However, if new segment 212(k) cannot be allocated (e.g., all segments are allocated among all hash tables, or hardware limitations, etc.) failure may be returned at 262.

Operations 250 may be suitable for data sets having huge sizes (e.g., 500K to 1 million items that are either strictly consecutive, or completely random). Operations 250 may not be suitable for small data sets (e.g., 32K), or, where the items are not completely random, or not strictly consecutive. In various embodiments, the segment size may be 256, which can be indexed by the prefix bits (8 bits) directly. In the case of a set of consecutive prefixes, 256 consecutive prefixes may be needed to achieve 100% utilization. In the case of random prefixes, the randomness can ensure that 256 such prefixes are hashed to the same bucket. At high scale scenario, the condition is likely to be met, but in the low scale, the condition may not be easily met.

In low scale cases, typically, 30 to 40 prefixes may be consecutive, and consequently, 200 of the segments can not be indexed, and may be wasted. If the segment size were larger (e.g., 8 times bigger), utilization may be improved (e.g., approximately 95%), indicating that the hashing technique may be suitable for any data set size, whereas the size of the segments can impact utilization.

In some embodiments, the prefix bits used to index hash tables 206(1)-206(N) may be consecutive. However, typically X number of prefixes may be consecutive (e.g., last few bits may be incrementing), and one of the other prefix bytes may be varying.

For example, the prefix list could include 10 prefixes starting at 1.1.1.0/24, and another 10 prefixes starting at 1.2.1.0/24, etc. The second prefix byte may dictate how many prefixes are consecutive. Thus, combining the least significant bit (LSB) of the second prefix byte with the last few bits of the prefixes to form the 8 bit hash index may yield better utilization in the example. The avalanche property of the hashing technique used in operations 250 may be suitable for some (but not all) data sets.

Figure 24:
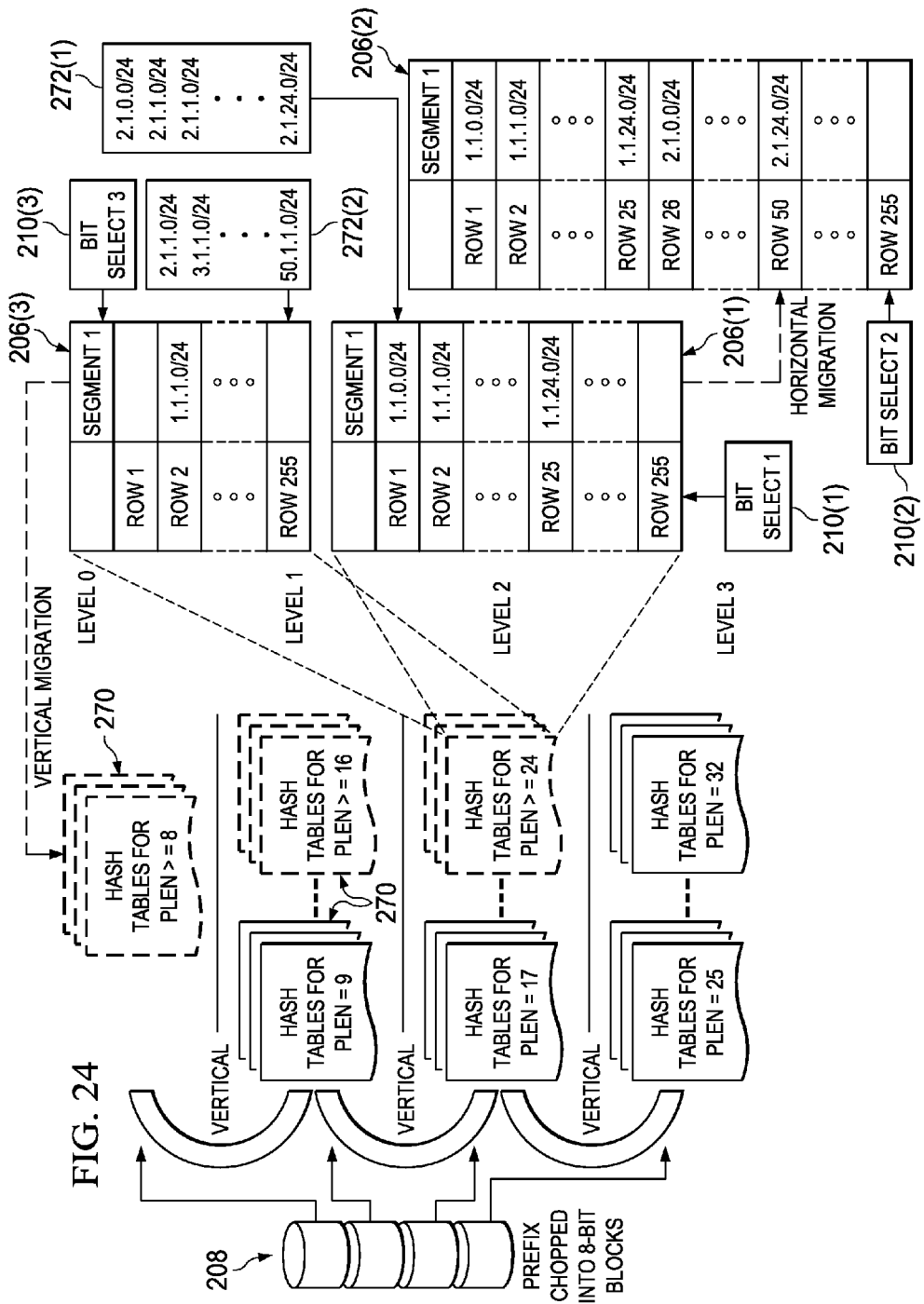
FIG. 24 is a simplified block diagram illustrating yet other example details that may be associated with an embodiment of the communication system.

Turning to FIG. 24, FIG. 24 is a simplified block diagram illustrating example details of another embodiment of communication system 10. Prefix 208 may be inserted into one of several hash table sets 270. In various embodiments, hash table sets 270 may be generated to store prefixes of varying prefix length.

In particular, a hash table set for a specific prefix length may include a plurality of hash tables, each distinguished from the other by a corresponding selection of bits (e.g., bit select 210) in the prefixes. Certain hash table sets 270 can be shared across multiple levels (e.g., prefixes of different lengths can be stored therein), as indicated by a dotted outline in the FIGURE.

Each of hash table sets 270 may include one or more hash tables. Hash table sets 270 may be created to accommodate prefix lists of varying size. IN various embodiments, prefix 208 may be mapped to multiple levels, and a plurality of hash tables 206(1)-206(m) may be selected at each level to determine placement of prefix 208 in one of segments 212(1)-212(K).

In various embodiments, communication system 10 may be configured with prefix 208, followed by a plurality of other prefixes formed by incrementing the last byte. Such a prefix list may be followed by another prefix list comprising consecutive prefixes, and so on. The entire prefix list can be viewed as a set of consecutive prefixes. The number of elements of the prefix list that can fit within one bucket may range from 1 to 256.

In various embodiments, bit select 210 for hashing the prefixes can be formed by combining 3 bits from different bytes with 5 bits of the last byte of prefix 208. For example, a /32 IPv4 prefix can have 3 bits from the LSB of prefix byte0, or byte1, or byte2, with 5 bits from byte3. Other combinations may also be used within the broad scope of the embodiments.

For example, one bit may be used from byte0, byte1, byte2, or 2 bits from byte0, one from byte1, etc. A collection of such bit select 210 for a specific prefix length can be viewed logically as one of hash table sets 270 for the specific prefix length. As used herein, the term "hash table set" refers to a set of hash tables (e.g., 206(1)-206(N)) configured for a specific prefix length. Each hash table in the hash table set may be indexed according to different bit select 210.

According to an example embodiment, an insertion algorithm may adapt to the input prefix list by picking a suitable hash table 206(1) in hash table set 270 (e.g., using clues from the values of the various bit selects). For example, if hashing of prefix 1.1.1.1/32 results in bit select 210(1) (bit select 1) that selects all 8-bits from the last byte, and if the subsequent prefixes in the prefix list include 2.1.1.1/32, 3.1.1.1/32, . . . 50.1.1.1/32, bit select 210(2) (bit select 2) may be generated with 3 bits from the first prefix byte, and 5 bits from the last prefix byte.

In other words, the segment into which prefix 1.1.1.1/32 was previously inserted (and indexed by bit select 210(1)) may be converted to a segment with different bit select 210(2). The process of converting a segment from one hash table 206(1) to another hash table 206(2) within the same hash table set 270 is termed as "horizontal migration."

In another example of horizontal migration, assume 25 prefixes {1.1.x.0/24}, where x ranges from 0 to 24 are hashed to hash table 206(1) of hash table sets 270 corresponding to prefix length 24 at Level 2. Assume that hash table 206(1) uses bits 16 to 23 as bit select 210(1). Assume that a prefix list 272(1) containing 25 prefixes: {2.1.x.0/24}, where x ranges from 0 to 24 is to be loaded into segments 212(1)-212(K).

Hash table 206(2) may accommodate all 50 prefixes (25 originally hashed prefixes and 24 new ones) with a different bit select 210(2), which may use 3 bits of the first byte, and 5 bits of the last byte. Hash tables 206(2) and 206(1) may be in same hash table set 270 at the same level (e.g., Level 2). To store all the 50 prefixes, the existing segment (e.g., segment 1) that has the 25 entries may be moved to hash table 206(2), and the new 25 prefixes from prefix list 272(2) may also be stored therein.

On the other hand, if the prefix list includes prefixes where the value of a prefix byte (e.g., prefix byte A) other than the last prefix byte increments more than the values in the other prefix bytes, or if the value is completely random, 8 bits of prefix byte A may be used as bit select 210 to pick a suitable hash table and corresponding level. In such a scenario, the segment may be moved from a hash table in one level to another hash table in a different level. This process can be called "vertical migration."

In an example of vertical migration, assume that hash table set 270 at level 2 that stores prefix lengths 24 and greater has a hash table 206(3) (with bit select 210(3) (bit select 3) chosen as bits 16-23), and has only one entry 1.1.1.0/24. Assume that a prefix list 272(12) containing 50 new prefixes is to be accommodated in one of hash table sets 270. The 50 prefixes include {x.1.1.0/24}, where x ranges from 2 to 50.

A suitable hash table for prefix list 272(1) may be located in level 0, and with bit select including bits 0-7. Accordingly, embodiments of communication system 10 may insert the 51 prefixes into the segment (e.g., segment 1) storing 1.1.1.0/24, and move the segment from level 2 to level 0 in a vertical migration.

While at the abstract level, there may be no difference between horizontal migration and vertical migration (e.g., both involve migrating a segment from one hash table indexed with a specific bit select to another hash table indexed with another bit select), in horizontal migration, a segment can be freely migrated across any hash tables within hash table set 270. In vertical migration, according to some embodiments, the segment can be moved from a higher level to a lower level (but not vice versa).

For example, if the prefix to be inserted is /31, any of the segment in the /31 hash table set at level 3 can be migrated to /24 or /16 or /8 hash table sets. A /24 hash table set can also be checked to see if it can be moved to /16 or /8. /16 hash table set may also be checked to see if any segment therein can be moved to /8 hash table set.

The chances of finding a segment with a mixed number of prefixes of varying lengths in the lower hash level may be low compared to finding a similar segment in the higher hash level, which can accommodate existing prefixes plus the new prefix. Therefore, migration from a lower level to a higher level may not be as effective as in the other direction.

To identify suitable bit selects and perform the horizontal or vertical migration as needed, state information may be maintained on a per segment basis. Such state information includes mapping between prefixes (e.g., prefix 208) and bit selects (e.g., bit select 210). A snapshot of state information may be stored in a compact form at the time of prefix insertion, so that subsequent lookups can be efficient.

For each bit select 210 for a given prefix length, the following information may be stored: (1) hash_entry_bit_map comprising n (e.g., 256) bits corresponding to n rows of segments 212(1)-212(K) to check if the entry can be stored in a hash table; (2) hash_possible_flag comprising 1 bit per segment to summarize a hash possibility (e.g., if all the prefixes of the segment can be hashed using the bit select); (3) hash dispersion counter, comprising 8 counters to reflect possible values of 3 upper bits of the bit selects.

Hash_entry_bit_map may be initially set to zero, and the hash_possible_flag may be set to TRUE. When a prefix is mapped to the hash_entry_bit_map, the corresponding bit may be turn on. If and when another prefix is mapped to the same bit that was previously set, the hash_possible_flag may be turned to FALSE.

The hash dispersion counter may keep track of distribution of the prefixes in the 8 possible 32 entry blocks. For a given bit select, if all the prefixes are mapped to the same 32 entry block, the bit select may not be suitable for the prefixes. On the other hand, if the prefixes are evenly distributed over the 8 blocks, the bit select may be suitable.

Based on the hash_dispersion_counter, a dispersion ratio (i.e., mean of difference between the average dispersion and the actual dispersion) can be calculated. Dispersion is a measure of the spread (or variability) of the hash distribution (e.g., in bit selects of a specific hash table set). Common examples of measures of dispersion include variance, standard deviation, and interquartile range.

In various embodiments, each hash table maintains a doubly linked list (e.g., linked list containing a head pointer or index, wherein each node contains two pointers or indices, one to the previous node and another to the next node in the list) of segments, sorted based on the dispersion ratio. The segment with the most suitable dispersion ratio may appear at the top of the list, and the segment with the least suitable dispersion ration may appear at the bottom of the list.

A transient data structure (lvl_list_t) to cache information about the hash tables at each level corresponding to a specific prefix may also be maintained. A transient linked list is a linked list (e.g., a data structure consisting of a group of nodes that together form a sequence), in which a new node is created each time an object is inserted into the list. In general, each node in the linked list contains a pointer or index (in case of an array) to the next node, along with the data represented by the node.

The transient data structure lvl_list_t may store the following information: hash table set id (hash_tbl_id); pointer to the candidate segment (p_cand_seg); best utilized hash table id (best_util_hash_num); best utilization metric (best_util_metric); hash bucket index (bucket) for possible hash tables at a given level; maximum hash tables possible for a level; value of upper 3 bits for each possible hash table at a given level (hash_type_val); and total depth (maximum depth of the hash tables at a level). The transient data structure may be thereafter used to hash prefixes to segments 212(1)-212(K).

Turning to FIG. 26, FIG. 26 is a simplified flow diagram illustrating example operations that may be associated with an embodiment of communication system 10. Operations 280 include 282, at which prefix 208 may be partitioned into multiple blocks, and a lower 5 bits of each block may be calculated. For byte aligned prefixes, level 0 may have the lower 5 bits of byte0, level 1 may have lower 5 bits of byte1, and so on. For unaligned prefixes, bits can be borrowed from the previous byte. At 284, a transient linked list (p_lvl_list) to keep track of information at each level.

For each level, the following operations may be performed. At 286, a node (p_lvl_node) of type lvl_list_t (i.e., p_lvl_node corresponds to linked list lvl_list_t) may be allocated to the transient linked list. At 288, the lower 5 bits of the hash bucket (as derived at operation 282) may be stored in p_lvl_node. At 290, hash table set 270(1) may be chosen based on the prefix length.

For each hash table 206 in hash table set 270(1), the following operations may be performed. At 292, hash table 206(1) may be checked to determine if it is the best utilized hash table so far. If hash table 206(1) is not the best utilized hash table so far, the best utilized hash table ID (best_util_hash_num) and best utilization metric (best_util_metric) of the hash level linked list may be updated.

At 294, hash table 206(1) may be checked for free slots. If free slots are available, a first free segment may be obtained by walking from the segment (denoted as p_best_seg) with a suitable dispersion ratio. In some embodiments, the segment with the best dispersion ration in hash table 206(1) may be selected to start the walk. If the dispersion ratio of the free segment is best so far (e.g., more suitable than p_best_seg), a pointer (p_cand_seg) to the free segment may be updated to point to the free segment. The operations may loop back to 292 for next hash table 206(2) in hash table set 270(1).

At 296, if a free segment is available in the level, the prefix may be inserted into the segment and the operations stopped thereupon. At 298, if a free segment is not available, horizontal migration may be performed, if possible. For example, existing segments may be checked to see of any one of them can be moved to another hash table with modified bit selects.

The prefix can be inserted into the moved segment, which can continue to hold the old items in the segment using flags, such as hash_possible_flag and hash_entry_bit_map fields of the segment. In some embodiments, p_worst_seg (e.g., pointer to a segment with an unsuitable dispersion ratio) may be used as a starting point to scan the segments for horizontal migration. The operations may loop back to 286, and repeated for the next level, if no free segments are available in the level under analysis.

If no free segments are available in any level, at 300, vertical migration may be performed, if possible. Segments may be scanned to determine if any segment can be moved across levels. For example, the transient linked lists may be walked to determine if any of the segments can be moved to any other hash table.

In some embodiments, the segment with the worst dispersion ratio can be used as a starting point for the walk. In some embodiments, vertical migration may be performed in a direction from a higher level to a lower level, for example, to reduce the amount of computation resource needed. Higher level hash tables may be selected substantially all tie breaker scenarios, and by default, the prefix may be placed in the higher level hash table (even if a lower level hash table is available). The chances of a segment successfully getting rehashed may be higher when vertical migration is performed from the higher to the lower level.

If no free segment is available, at 302, a free segment from a free list may be selected and inserted into the hash table with the best utilization. If multiple levels have the same utilization metrics, then the hash table at a higher level is chosen.

In many embodiments, the prefixes in a prefix list may be consecutive, and the last few bits may be incrementing, which means a segment at the higher level has a better chance of getting filled up. At 304, if there is no free segment available (e.g., all segments have been populated with prefixes, or hardware limitations do not permit additional prefixes, etc.), then FAILURE may be returned, and the prefix may not be stored in SLTCAM 19.

Turning to FIGS. 26A-26F, FIGS. 26A-26F are simplified diagrams and tables illustrating simulations of example operations associated with embodiments of communication system 10. In the simulations, the number of allocated segments was defined as the ratio of the number of prefixes in the prefix list to 256; and utilization was defined as the ratio of the number of prefixes successfully inserted to the total number of rows in SLTCM 19.

In various simulations, hash efficiency of the algorithms used in implementing the operations described herein could be measured using the utilization. In some simulations, wherein segment pairs were simulated (e.g., to simulate 512 bit segments), the simulation code was implemented to insert segments in pairs, but the moves (e.g., horizontal and vertical migrations) were not performed in pairs, so the results may be a little skewed.

FIG. 26A is a simplified diagram illustrating four example configuration sets used in simulations according to an embodiment of communication system 10. A configuration set (set 1) (not shown) with a customer provided profile was used in the simulations to analyze the operations described herein with reference to AMULHASH module 24.

Set 1 included 3 VRFs, arbitrary patterns and approximately 25K IPv4 univast prefixes. Additional configuration sets 310 (set 2), 312 (set 3), 314 (set 3), and 316 (set 4) were also used in the simulations. Each bracket in sets 310-314 indicates the starting prefix, prefix length and number of prefixes. For example, {0x01000000, 8, 10} indicates a starting prefix of 0x01000000, with a prefix length of 8 and 10 prefixes thereafter.

In some simulations, the prefixes were consecutive; in other simulations the prefixes were random. Set 310 included 50 VRFs, and 47 patterns with various numbers of prefixes for each pattern; set 312 included 1 VRF and 25 patterns with various numbers of prefixes for each pattern; set 314 included 1000 VRFs and 25 patterns with 40 prefixes for each pattern; and set 316 included 1000 VRFs and 25 patterns with 30 prefixes for each pattern.

FIG. 26B shows utilization for the various sets. The first results column represents consecutive prefixes, and the second results column represents random prefixes. In the simulations, utilization varied from 76% to 99% (for 256 bits per segment case). Utilization varied from 66% to 99% (for 512 bits per segment case). Utilization was almost identical for consecutive and random prefixes (of same profile) with random prefixes exhibiting slightly better utilization (but at the cost of update performance). Utilization was better than in a regular SLTCAM, which did not implement AMULHASH module 24.

FIG. 26C shows update cost in seconds for the various sets. The convergence took less time for low scale (up to 300K) scenarios, but for high scale (1 million) configurations, the convergence took up to 360 seconds. For a dual segment (512 bit segment) case, the numbers were higher, but it was not clear whether the results were due to the specific model used (e.g., pairing two segments together).

Updated cost (related to control plane performance) was better for low VRF cases (e.g., 50 VRFs max), as the number of prefixes moved was relatively higher for higher VRF configurations. Updated cost and utilization were consistent across multiple simulation runs.

FIG. 26D shows overhead for prefix movements for the various sets. About 1-10% of the prefixes were moved to make spaces for new prefixes for most cases. In a specific case (set 1), 25% of the prefixes were moved. In general, the overhead ratio related to prefix movement was better with higher scale.

FIGS. 26E and 26F show the simulation test results with a fixed number of available segments, where the segments are allocated one at a time to the hash tables for consecutive prefixes and random prefixes, respectively. Fixed number of segments may simulate actual hardware capabilities, and results may indicate real, practical scenarios, and provide estimates of worst case requirements for a given prefix list.

Utilization may be distorted, as the number of segments allocated was more than ideal or minimum number of segments needed for the particular prefix list. The utilization ranged from 75% to 100%, and the number of segments used ranged from 50% to 100%.

The results (e.g., utilization, cost, segments moved) were acceptable all simulated cases. For example, all the prefixes could be fit into the allocated segments in most cases. In one case (high VRF case), only 67% of the entries could fit. For set 1, almost all the segments (188) are used up for inserting 99% of the entries (for a single segment case), and 100% of the prefixes (for a double segment case). Thus, there was no space left over for other lists (e.g., multicast, IPv6, etc.).

When the number of allocated segments was set to 96, the utilization rate was about 76%, indicating that 76% of the prefixes could be fit into 96 segments. 24% of the prefixes consumed the other 50% of the segments. It is likely that the 24% could not be hashed properly, resulting in allocating new segments. One possible solution in such scenario would be to identify those prefixes that could not be fit into any of the allocated segments, and put them in an overflow TCAM (e.g., of size 4K).

Note that the numerical and letter designations assigned to the elements of the preceding FIGURES do not connote any type of hierarchy; the designations are arbitrary and have been used for purposes of teaching only. Such designations should not be construed in any way to limit their capabilities, functionalities, or applications in the potential environments that may benefit from the features of communication system 10. It should be understood that communication system 10 shown in the FIGURES is simplified for ease of illustration. Moreover, communication system 10 can include any number of illustrated elements within the broad scope of the present disclosure.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Note also that an 'application' as used herein this Specification, can be inclusive of an executable file comprising instructions that can be understood and processed on a computer, and may further include library modules loaded during execution, object files, system files, hardware logic, software logic, or any other executable modules.

In example implementations, at least some portions of the activities may be implemented in LPTCAM 18 and/or AMULHASH module 24. In some embodiments, one or more of these features may be implemented in hardware, provided external to these elements, or consolidated in any appropriate manner to achieve the intended functionality. The various network elements (e.g., routers 14(1)-14(N)) may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, LPTCAM 18 and AMULHASH module 24 described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities.

In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory elements 28, 202) can store data used for the operations described herein. This includes the memory element being able to store instructions (e.g., software, logic, code, etc.) in non-transitory media, such that the instructions are executed to carry out the activities described in this Specification.

A processor can execute any type of instructions associated with the data to achieve the operations detailed herein in this Specification. In one example, processors (e.g., processors 29, 200) could transform an element or an article (e.g., data) from one state or thing to another state or thing.

In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an Application Specific Integrated Circuit (ASIC) that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs.

The information being tracked, sent, received, or stored in communication system 10 could be provided in any database, register, table, cache, queue, control list, or storage structure, based on particular needs and implementations, all of which could be referenced in any suitable timeframe.

Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts.

In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, communication system 10 may be applicable to other exchanges or routing protocols.

Moreover, although communication system 10 has been illustrated with reference to particular elements and operations that facilitate the communication process, these elements, and operations may be replaced by any suitable architecture or process that achieves the intended functionality of communication system 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method, comprising:
partitioning a memory element of a router into a plurality of segments comprising one or more rows, wherein at least a portion of the one or more rows is encoded with a value mask (VM) list comprising a plurality of values and masks, wherein the VM list is identified by a unique label distinguishing it from other VM lists, wherein the VM lists correspond to rule lists of one or more policies;
mapping, in a table separate from the plurality of segments, the label to a base row number and a specific number of bits corresponding to the portion encoding the VM list, the base row number indicating a start of rows encoding the VM list, and the specific number of bits indicating a consecutive number of bits used for the VM list;
receiving a search key comprising the label identifying the VM list;
identifying the label in the search key;
determining, from the table, a read address of a specific row in the portion of the plurality of segments based on the base row number and the specific number of bits indicated by the label;
accessing the specific row in the plurality of segments; and
comparing the search key with the plurality of values and masks in the specific row.

2. The method of claim 1, wherein the partitioning is according to buddy memory allocation.

3. The method of claim 2, wherein the buddy memory allocation is implemented using a table in each segment comprising at least R/2 bit positions, indexed from 0 to R/2-1, wherein R is the total number of rows in the respective segment.

4. The method of claim 3, wherein the base row number is divided by 2 to obtain an index in the table, wherein the index is used derive a consecutive number of bit positions starting therefrom, corresponding to the specific number of bits, wherein the consecutive number of bit positions are used to select the specific number of bits from the search key.

5. The method of claim 4, wherein the specific number of bits is selected from the search key, the selected bits are concatenated into a binary value, and the binary value is added to the base row number to obtain the read address of the specific row.

6. The method of claim 4, wherein if the VM list occupies more than half the total number of rows in the segment, the specific number of bits is selected from the search key, the selected bits are transformed into a compressed value, and compressed value is added to the base row number to obtain the read address of the specific row.

7. The method of claim 2, wherein the buddy memory allocation is implemented using a table in each segment comprising at least (R−1) bit positions, indexed from 0 to (R−2), wherein R is the total number of rows in the respective segment, such that each bit position corresponds to a node in a decision tree.

8. The method of claim 7, wherein the base row number is used as an index in the table to derive bit positions starting therefrom, numbering 1 less than 2 to the power of the specific number of bits, wherein the bit positions are used to select the specific number of bits from the search key according to a decision tree algorithm.

9. The method of claim 8, wherein the specific number of bits is selected from the search key according to the decision tree algorithm, the selected bits are concatenated into a binary value, and the binary value is added to the base row number to obtain the read address of the specific row.

10. The method of claim 2, wherein the buddy memory allocation is implemented using a table in each segment comprising at least (3R/2-2) bit positions, indexed from 0 to (3R/2-3), wherein R is the total number of rows in the respective segment, such that each bit position corresponds to a node in a decision tree.

11. The method of claim 10, wherein the base row number is used as an index in the table to derive bit positions starting therefrom, wherein if the VM list occupies more than half the total number of rows in the segment, the index is modified to R/2 instead of the base row number, wherein the bit positions number 1 less than 2 to the power of the specific number of bits, and wherein the bit positions are used to select the specific number of bits from the search key according to a decision tree algorithm.

12. The method of claim 11, wherein the specific number of bits is selected from the search key according to the decision tree algorithm, the selected bits are transformed into a compressed value, and compressed value is added to the base row number to obtain the read address of the specific row.

13. The method of claim 1, wherein the VM list fits into a single row in each segment if the specific number of bits is zero.

14. Logic encoded in non-transitory media that includes instructions for execution and when executed by a processor, is operable to perform operations comprising:
  partitioning a memory element of a router into a plurality of segments comprising one or more rows, wherein at least a portion of the one or more rows is encoded with a VM list comprising a plurality of values and masks, wherein the VM list is identified by a unique label distinguishing it from other VM lists, wherein the VM lists correspond to rule lists of one or more policies;
  mapping, in a table separate from the plurality of segments, the label to a base row number and a specific number of bits corresponding to the portion encoding the VM list, the base row number indicating a start of rows encoding the VM list, and the specific number of bits indicating a consecutive number of bits used for the VM list;
  receiving a search key comprising the label identifying the VM list;
  identifying the label in the search key;
  determining, from the table, a read address of a specific row in the portion of the plurality of segments based on the base row number and the specific number of bits indicated by the label;
  accessing the specific row in the plurality of segments; and
  comparing the search key with the plurality of values and masks in the specific row.

15. The logic of claim 14, wherein the partitioning is according to buddy memory allocation.

16. An apparatus, comprising:
  a control module;
  a memory element for storing data; and
  a processor that executes instructions associated with the data, wherein the control module, the processor and the memory element cooperate, such that the apparatus is configured for:
    partitioning a memory element of a router into a plurality of segments comprising one or more rows, wherein at least a portion of the one or more rows is encoded with a VM list comprising a plurality of values and masks, wherein the VM list is identified by a unique label distinguishing it from other VM lists, wherein the VM lists correspond to rule lists of one or more policies;
    mapping, in a table separate from the plurality of segments, the label to a base row number and a specific number of bits corresponding to the portion encoding the VM list, the base row number indicating a start of rows encoding the VM list, and the specific number of bits indicating a consecutive number of bits used for the VM list;
    receiving a search key comprising the label identifying the VM list;
    identifying the label in the search key;
    determining, from the table, a read address of a specific row in the portion of the plurality of segments based on the base row number and the specific number of bits indicated by the label;
    accessing the specific row in the plurality of segments; and
    comparing the search key with the plurality of values and masks in the specific row.

17. The apparatus of claim 16, wherein the partitioning is according to buddy memory allocation.

18. The apparatus of claim 17, wherein the buddy memory allocation is implemented using a table in each segment comprising at least R/2 bit positions, indexed from 0 to R/2-1, wherein R is the total number of rows in the respective segment.

19. The apparatus of claim 18, wherein the base row number is divided by 2 to obtain an index in the table, wherein the index is used derive a consecutive number of bit positions starting therefrom, corresponding to the specific number of bits, wherein the consecutive number of bit positions are used to select the specific number of bits from the search key.

20. The apparatus of claim 19, wherein the specific number of bits is selected from the search key, the selected bits are concatenated into a binary value, and the binary value is added to the base row number to obtain the read address of the specific row.

* * * * *